United States Patent [19]

Garrett

[11] 4,415,526
[45] Nov. 15, 1983

[54] METAL PHTHALOCYANINE ON A SUBSTRATE

[75] Inventor: David L. Garrett, Cupertino, Calif.

[73] Assignee: Metco Properties, Chicago, Ill.

[21] Appl. No.: 111,079

[22] Filed: Jan. 10, 1980

Related U.S. Application Data

[63] Continuation-in-part of Ser. No. 801,636, May 31, 1977, which is a continuation-in-part of Ser. No. 535,218, Dec. 23, 1974, abandoned, which is a continuation-in-part of Ser. No. 166,687, Jul. 28, 1971, abandoned.

[51] Int. Cl.$^3$ .............................................. G21C 3/02
[52] U.S. Cl. .................................... 376/409; 376/416; 376/320; 357/8; 357/29; 136/253
[58] Field of Search ............... 350/357; 252/600, 644; 357/8, 29; 136/236, 253; 376/409, 416, 320; 428/220

[56] References Cited

U.S. PATENT DOCUMENTS

| | | | |
|---|---|---|---|
| 2,726,178 | 12/1955 | Nelson et al. | 427/5 X |
| 3,027,391 | 3/1962 | Frigerio | 8/76 |
| 3,198,711 | 8/1965 | McPartland et al. | 136/236 X |
| 3,249,830 | 5/1966 | Adany | 357/8 X |
| 3,257,570 | 6/1966 | Dehmett et al. | 357/29 X |
| 3,651,386 | 3/1972 | Youtsey et al. | 357/8 X |
| 3,789,216 | 1/1974 | Komp | 357/8 X |
| 4,306,774 | 12/1981 | Nicholson | 252/600 X |

OTHER PUBLICATIONS

Brophy et al, *Organic Semiconductors*, MacMillan & Co., N.Y., N.Y., 1962, pp. IX–XI.
Krunick Elec. Conduction in Uranyl Phthalocyanine, Nuc. Sci. Abst., vol. 20, #19, p. 4352, #35917 (1966).

*Primary Examiner*—Peter A. Nelson
*Attorney, Agent, or Firm*—Clement and Ryan

[57] ABSTRACT

A nuclear fission electrical generator for extracting electrical power from fissionable material having semiconductor characteristics without the necessity of an intervening thermal energy. Unwanted, randomly created electron-hole pairs are depleted from the semiconductor material. Phthalocyanine semiconductor are suitable, and uranium phthalocyanine is particularly suitable for use in this invention.

30 Claims, 21 Drawing Figures

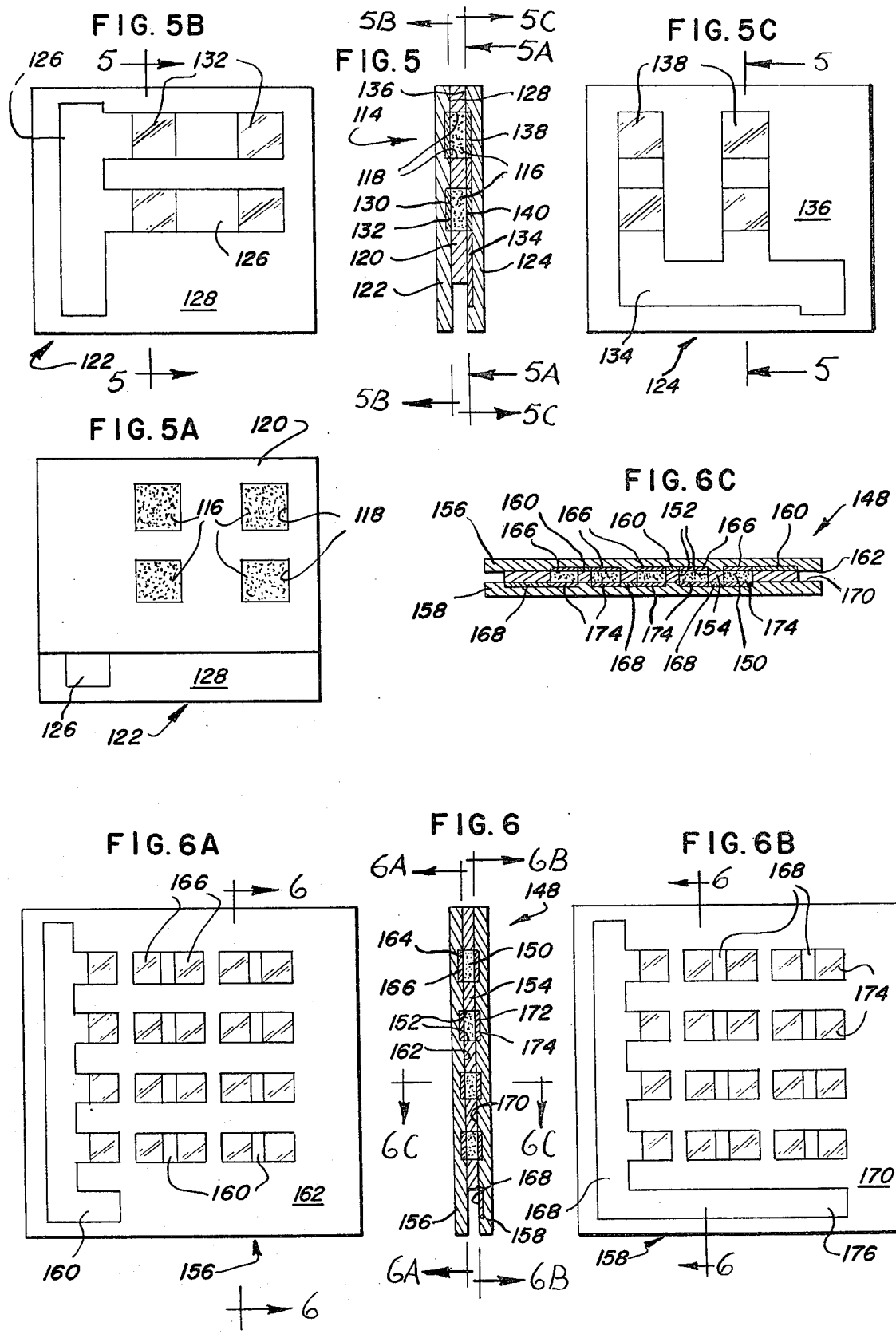

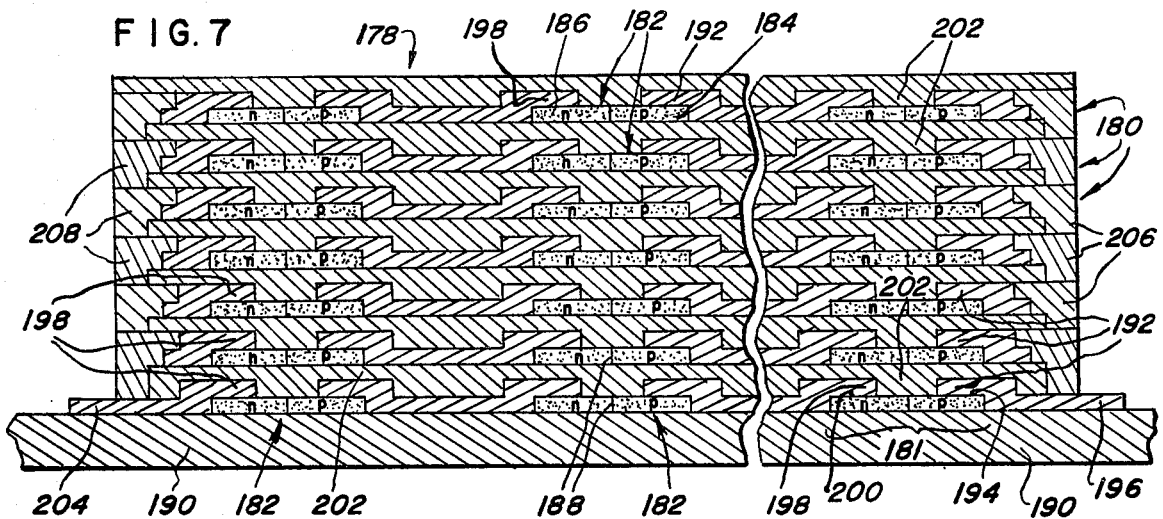
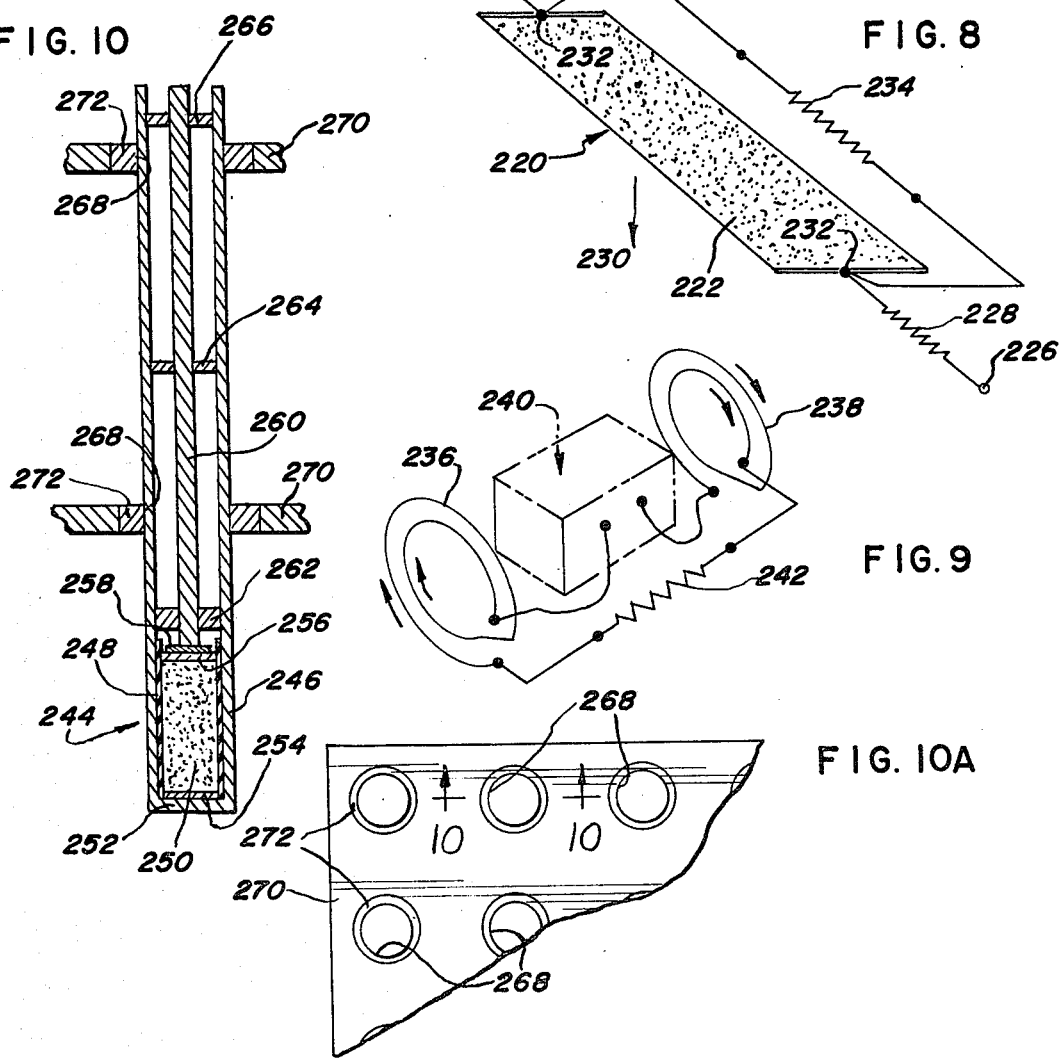

METAL PHTHALOCYANINE ON A SUBSTRATE

This application is a continuation-in-part of my copending application entitled "Method and Apparatus for Producing Electrical Power" filed May 31, 1977 and assigned Ser. No. 801,636, which was a continuation-in-part of a similarly entitled application filed Dec. 23, 1974 and assigned Ser. No. 535,218, which was in turn a continuation-in-part of a similarly entitled application filed July 28, 1971 and assigned Ser. No. 166,687, the latter two applications being both now abandoned.

This invention relates to the extraction of electrical power from a fissionable material without the necessity of an intervening thermal energy stage. It has now been discovered that by using the method and apparatus of the present invention the vast energy available from the nuclear fission event may be harnessed directly for useful purposes, without the necessity of any heat conversion step. The apparatus of this invention may be characterized as a nuclear fission electrical generator.

BACKGROUND OF THE INVENTION

It has become clear the last few years that in the very near future our civilization will require great increases in the production of electrical power to meet the growing power demands of our increasingly mechanized and industrialized society. It is also clear, for a number of reasons, that it will be highly desirable if the increased electrical power is provided from sources other than a conventional steam turbine generator using coal or oil as its fuel.

One reason for this latter fact is that the available supply of fossil fuels such as coal and oil is limited. A second reason is the serious pollution problem that has already arisen from the burning of coal and oil to obtain electrical power. (In fact, many of the very methods which have been suggested for combating our present or prospective levels of pollution will themselves require electrical power, and thus will present an added pollution problem if they are put into effect relying on a source of power that requires the burning of still more coal and oil.) A third reason is that new sources of electrical power will hopefully produce a substantial reduction in the cost of producing such power. Finally, the desirability of conserving fossil fuels for their value to the chemical industry, particularly in the resin field, is very clear.

Nuclear power is now used to some extent as a substitute for coal or oil for the production of superheated steam for use in conventional steam turbine generators. But neither coal, oil, nor nuclear power achieves a very high level of efficiency in this mode of generating electrical power.

In accordance with the laws of thermodynamics and mechanical efficiency, the maximum theoretical efficiency for a steam turbine is about 45 percent. As a practical matter, coal and oil powered electrical generators usually operate at only about 39 percent efficiency. Nuclear electrical plants usually operate, under normal operating procedure, at a still lower level—only about 32 percent efficiency. Even with the remarkably improved theoretical efficiency projected for the magnetohydrodynamic generator coupled with a steam generator, it is believed that the maximum efficiency obtainable with such a system would be no more than about 55 to 65 percent for an extremely large and efficient plant.

DISADVANTAGES OF THE NUCLEAR POWER PRIOR ART

At the outset of the nuclear age, it was widely assumed that nuclear power was a source of energy that would someday provide endless electrical power at extremely cheap rates. As things have turned out, however, nuclear power has so far not reduced the cost of electrical power when it has displaced other fuels in use. Nuclear power has replaced the fossil fuels as the source of heat in the power equation, but the conversion of the thermal energy of steam into electrical power and its inherent limiting factors have remained the same. Indeed, as already indicated, today's steam nuclear reactors are actually of less overall thermal efficiency than modern fossil-fueled electrical plants.

Moreover, the tremendous heat output of the nuclear reaction has led to ecological problems, particularly as regards the difficult matter of thermal pollution.

In addition, the huge plant size required for efficient electrical production with today's steam reactor, as well as the complex heat exchange systems required in such plants, have contributed to the high capital costs of nuclear plants. The large capital investment required in these plants has in part prevented a decrease in the price of nuclear produced electric power.

ATTEMPTS AT DIRECT CONVERSION OF LOW ENERGY NUCLEAR RADIATION INTO ELECTRICAL ENERGY

In order to overcome the disadvantages mentioned, there have been a number of attempts to achieve direct conversion of certain relatively low energy types of nuclear radiation (e.g., alpha and beta radiation) into electrical energy, but these attempts have not produced electrical power at a level competitive to any significant extent with power from conventional sources.

Linder U.S. Pat. No. 2,527,945, for example, discloses a method and apparatus for generating direct electrical energy from nuclear reactions. Linder is directed toward the utilization of radiation which possesses relatively low energy—such as alpha particles having energy levels of up to about 10 Mev (million electron volts) and beta particles having energy levels of about 0.1 to 3 Mev—in comparison with the extremely high energy of the order of about 201 Mev available from nuclear fission, which is the phenomenon utilized in the present invention. In any event, the Linder technique has not met with success because the high electrical impedance necessary in the practice of the invention requires the use of a very high voltage, which in turn produces a leakage current of a magnitude that severely limits the efficiency of the invention to the point where the method has little, if any, practical value.

Other direct energy conversion techniques have been extensively studied for many years by various nuclear oriented companies. These techniques, which utilize semi-conductors, are illustrated by U.S. Pat. Nos. 2,745,973; 2,819,414; 2,847,585; 3,094,634; 3,257,570; 3,304,445 and others. The energy conversion devices disclosed in these patents, like the Linder patent, are designed for use with relatively low energy radiation such as alpha and beta particles, or neutral radiation such as gamma rays and neutrons, rather than the vastly higher energy resulting from nuclear fission which is utilized in this invention.

ATTEMPTS TO CONVERT NUCLEAR FISSION ENERGY INTO ELECTRICAL ENERGY

A few attempts have been made in the prior art to convert the energy of nuclear fission into electrical energy without the conversion of the fission energy into heat to produce steam to drive the turbine of a generator. These attempts—which fall into two categories—represent entirely different approaches from the present invention, and have in any event not been successful for meeting the power demands of the commercial and home electrical user.

The first category is illustrated by Katz U.S. Pat. No. 3,167,482. This patent discloses a method of extracting electrical energy from a fissionable semi-conductor material, with the heat of nuclear fission not being used to produce steam but for another purpose. In the Katz method, thermoelectric elements are used to form the junctions of a thermopile which is activated by the heat produced from nuclear fission. Inasmuch as an intervening thermal conversion step is required in this method to extract electrical energy from nuclear fission, this technique suffers from many of the deficiencies of other prior art.

British Pat. No. 900,056 represents a method for producing electrical power from the positively charged fission fragments resulting from nuclear fission, using an electrical grid system somewhat similar to that disclosed in Linder U.S. Pat. No. 2,527,945, discussed above. In this British patent, the kinetic energy of the fission fragments is used as the means of locomotion, or travel, to convey charged fragments through an evacuated space to a collection surface, where the positive charges are accumulated to produce a voltage. The technique of this British patent has proved to be unsatisfactory in actual application, as indicated in the article entitled "Fission-Fragment Conversion Reactors for Space" in 12 *Nucleonics* 80 (April 1963), in which the results of attempts to produce electrical power in a manner similar to the method disclosed in the patent are reported.

A similar disclosure is contained in Australian published specification No. 260,879. The inadequacy of the technique disclosed in that specification was evidently recognized by the applicant itself, for the application was permitted to lapse before acceptance.

It is seen that those pursuing these two categories of attempts to convert nuclear fission energy into electrical energy, whatever their limited results may have been, have failed to understand the true potential of nuclear power. Indeed, until the present invention, no one skilled in the nuclear science arts has been able to find a way successfully to convert the kinetic energy of the nuclear fission event directly into electrical energy without an intervening thermal energy stage.

PRIOR ART BELIEF THAT KINETIC ENERGY OF NUCLEAR FISSION MUST BE UTILIZED AS HEAT

The following table from Glasstone, *Principles of Nuclear Reactor Engineering* (D. Van Norstrand Co., 1955), page 22, illustrates the average energy available from a single nuclear fission event, and the typical distribution of this energy in its principal forms:

TABLE I

| ENERGY FROM NUCLEAR FISSION | |
|---|---|
| | Mev |
| Kinetic energy of fission fragments | 168 ± 5 |
| Instantaneous gamma ray energy | 5 ± 1 |
| Kinetic energy of fission neutrons | 5 ± 0.5 |
| Beta particles from fission products | 7 ± 1 |
| Gamma rays from fission products | 6 ± 1 |
| Neutrinos | 10 (approx.) |
| Total fission energy | 201 ± 6 |

Those skilled in the nuclear science arts have, of course, long been aware of the vast energy—which is mainly kinetic energy—available from a single nuclear fission event. Heretofore, however, those skilled in the art have been unable to discover a successful method for directly utilizing the kinetic energy of nuclear fission without the necessity of an intervening thermal energy stage.

There are a number of reasons for this. For example, it is a universally held belief in the nuclear science community that the kinetic energy of nuclear fission fragments is inevitably reflected, upon collision of those fragments with other materials, in the instantaneous production of heat.

Thus, Samuel Glasstone in his text *Principles of Nuclear Reactor Engineering* referred to above states (at page 22) that "The major portion—over 80%—of the energy of fission appears as kinetic energy of the fission fragments, and this immediately manifests itself as heat." (Emphasis supplied.) Similarly, S. L. Soo, at page 141 of *Direct Energy Conversion* (Prentice-Hall Inc., 1968) makes the unqualified statement that, "The kinetic energy of the fission products appears as lattice vibrations from collisions with the surrounding materials and is released as thermal energies." (Soo goes on to add that still more heat is produced from other types of nuclear fission radiation.)

Another belief widely held by experts in the nuclear science arts which has argued against any attempt to convert the kinetic energy of nuclear fission into electrical power without an intervening thermal energy stage is the assumption that nuclear energy can perhaps never better thermoelectric systems in specific outputs. S. L. Soo, for example, expresses this thought at page 176 of the work just-cited, after discussing a number of direct energy conversion processes.

The following diagram, reproduced substantially as printed at page 115 of Alvin M. Weinberg and Eugene P. Wigner, *The Physical Theory of Nuclear Chain Reactors* (University of Chicago Press, 1958), may explain why those skilled in the nuclear science arts have not appreciated that the kinetic energy of the fission event could be utilized without the production of heat from the collision of fission fragments with other materials:

TABLE II

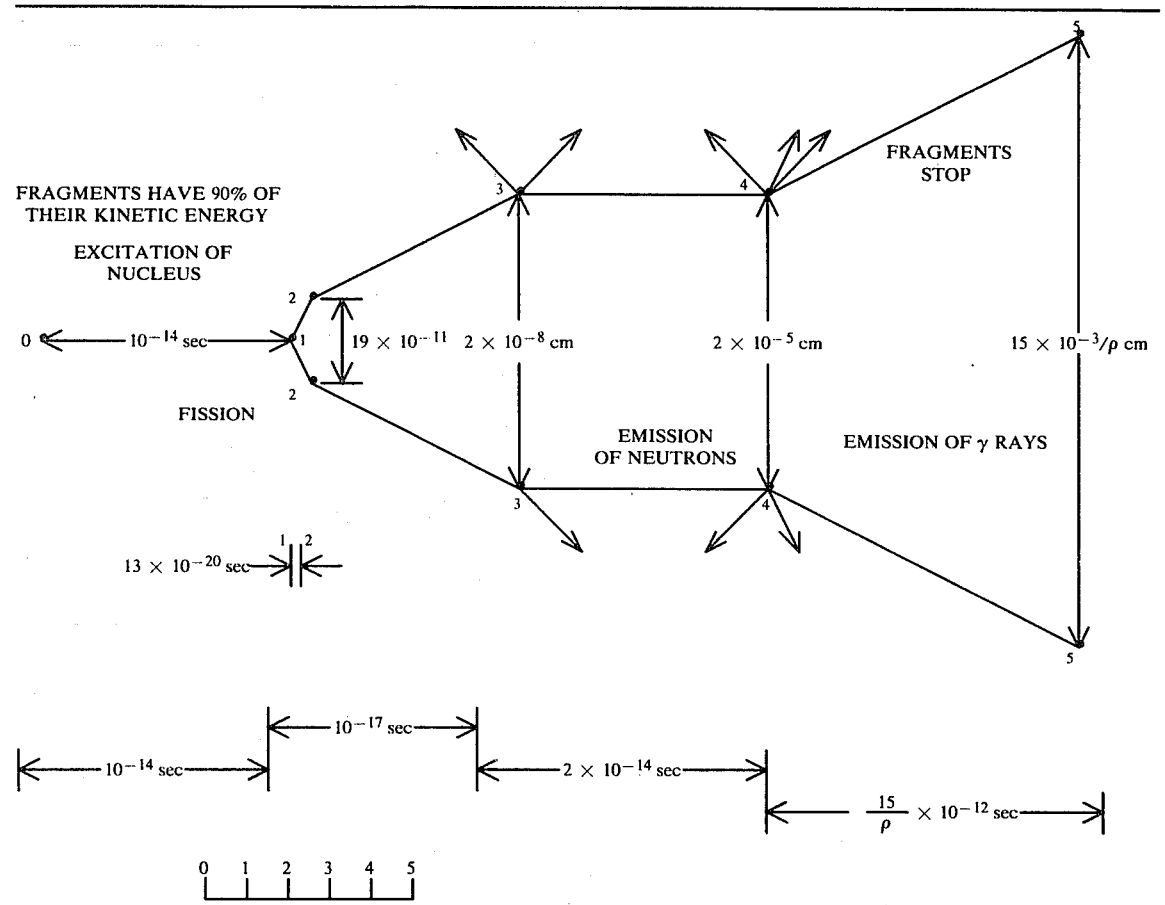

As explained in the text from which it is taken, the above diagram is a graphic representation of the fission process showing the minute time span from the inception of the fission event until all the energy of the fission fragments has been transformed into heat through collision of the fragments with other materials. The events illustrated in the diagram are: 0, excitation of nucleus; 1, fission; 2, fragments acquire 90 percent of their kinetic energy; 3, emission of neutrons; 4, emission of gamma rays; 5, fragments stop. The horizontal scale indicates the duration of the process; two events separated by the time t are $20 + \log_{10} t$ units apart horizontally. The vertical scale indicates the distance of the fragments from each other; a distance r is indicated by $13 + \log_{10} r$ units; $\rho$ is the density of the material in which the fragments travel, and the diagram is drawn for $\rho = 1$.

It is believed that substantially all the kinetic energy of the fission fragments represented by the above diagram is transformed into heat within about $2 \times 10^{-10}$ seconds after the movement of the fragments stops. Thus it is generally considered that the energy of fission fragments such as those shown in Table II above is converted from kinetic energy to heat energy within a fraction of one billionth of a second after the fission event takes place. In view of this extremely fast reaction time, it is understandable that those skilled in the nuclear science arts have believed that for practical purposes the fission event could never be anything but a heat producing event.

The belief in the necessity of a thermal conversion process for obtaining electrical energy from the kinetic energy of nuclear fission has been so universal that leading workers in the nuclear science field have assumed that it is only through the use of steam turbine generators—which, of course, rely on the availability of large amounts of heat to change great quantities of water into superheated steam—that the ultimate promise of nuclear fission power can be achieved. Thus, in a recent article in *Scientific American* (November 1970), entitled "Fast Breeder Reactors," Glenn T. Seaborg, Chairman of the United States Atomic Energy Commission, and Justin L. Bloom, Assistant to the Chairman, advocated the use of "fast breeder reactors" as the hope of the future for utilizing nuclear fission in the production of electricity, and these eminent persons skilled in the nuclear science arts obviously thought of such reactors only for use in developing heat for the production of steam to drive the turbine of a conventional electrical generator.

Until the present invention, the statement by Glasstone at page 4 of his text *Principles of Nuclear Reactor Engineering*, referred to above, that "There is no method known at the present time for utilizing the major portion of the energy of fission except as heat" remained entirely true. Hence the present invention of a method and apparatus to extract electrical energy directly from the kinetic energy of nuclear fission without the necessity of an intervening thermal energy stage provided a wholly surprising result.

SUMMARY OF THE METHOD OF THIS INVENTION

In the method of this invention, by which electrical power is extracted from a fissionable material without the necessity of an intervening thermal energy stage, material capable of nuclear fission and having semi-conductor characteristics is subjected to nuclear excitation energy to produce nuclear fission at a rate sufficient to provide a supply of fission fragments from the fissionable material. The fissionable material is located so that fission fragments from the nuclear fission collide with the semi-conductor material, and these collisions, in accordance with conventional theory, produce electron-hole pairs in the semi-conductor material.

According to the present understanding of the method of this invention, charge carriers present in the semi-conductor material by reason of factors other than collision of fission fragments with the material are depleted from the semi-conductor material. The depletion of such randomly produced, unwanted charge carriers does not have to extend throughout the entire semi-conductor material, nor does it have to be one hundred percent complete in the areas in which it takes place. However, the more extensive the depletion is and the more complete it is in any given part of the semi-conductor material, the more effectively the method of this invention will operate.

The further steps in this method as presently understood are these. Electrons resulting from collision of fission fragments with the semi-conductor material are separated from holes resulting from such fission fragment collisions, and these electrons and holes are moved, respectively, in generally opposite directions within the semi-conductor material. Groups of electrons and groups of holes resulting from the fission fragment collisions are conducted to respective output terminals in operative electrical connection with the semi-conductor material. The output terminals are connected with each other through a circuit that includes an external load. This produces an electromotive force across the output terminals and a resulting electrical current through the load.

The depleting, separating, moving apart and conducting of electrons and holes are effected through at least one charge-affecting field of force within the semi-conductor material. As used in this specification and in the claims, the term "charge-affecting field of force" means any field of force, such as a voltage gradient or a magnetic field, that will cause positive or negative charge carriers to move within the field of force, or will influence the path of any charge carriers that are already moving in the field of force, by the effect of either attraction or repulsion upon the carriers.

The rate of production of electrons and holes from the collision of fission fragments with the semi-conductor material is maintained at a sufficiently high level to deliver to the external load a net positive yield of electrical power over the total input of any electrical power used to produce the charge-affecting field or fields of force by means of which the method of this invention is carried out. Preferably the rate of production of electron-hole pairs is maintained at a sufficiently high level that groups of electrons and groups of holes are conducted as described above toward output terminals with such frequency that a portion of each group of a given kind that has been thus conducted to its respective output terminal is present at the terminal simultaneously for an interval of time with a portion of the immediately preceding group of the same kind that has been conducted to the output terminal.

SUMMARY OF THE APPARATUS OF THIS INVENTION

This invention also includes a novel nuclear reactor for extracting electrical power from material capable of nuclear fission and having semi-conductor characteristics, without the necessity of an intervening thermal energy stage. Such a nuclear reactor may be characterized as a nuclear fission electrical generator.

The nuclear reactor of this invention includes means for subjecting fissionable material to nuclear excitation energy to produce nuclear fission, as well as means for supporting semi-conductor material in the path of fission fragments resulting from the nuclear fission. The collision of the fission fragments with the semi-conductor material, in accordance with conventional theory, will produce electron-hole pairs in the semi-conductor material. The nuclear reactor has output terminals positioned for operative electrical connection with at least two spaced portions of the semi-conductor material when the material is supported within the reactor, and means for connecting the output terminals with each other through a circuit that includes an external load.

According to the present understanding of the apparatus of this invention, means are provided for depleting from the semi-conductor material charge carriers present in the material by reason of factors other than collision of fission fragments with the semi-conductor material, for separating electrons and holes resulting from collision of fission fragments with the semi-conductor material and moving the electrons and holes, respectively, in generally opposite directions within the semi-conductor material, and for conducting groups of electrons and groups of holes resulting from fission fragment collisions to their respective output terminals. The means just described applies at least one charge-affecting field of force to the semi-conductor material. In one form of the apparatus, the means just described is external to the semi-conductor material.

The nuclear reactor has means for maintaining the rate of production of electrons and holes resulting from the collision of fission fragments with the semi-conductor material at a sufficiently high level to deliver to the external load, when the load is connected across the output terminals, a net positive yield of electrical power over the total input of any electrical power used to produce the charge-affecting field or fields of force by means of which the method of this invention is carried out. In a preferred embodiment, means is provided to maintain the rate of production of electron-hole pairs at a sufficiently high level that groups of electrons and groups of holes are conducted as described above toward output terminals with such frequency that a portion of each group of a given kind that has been thus conducted to its respective output terminal is present at the terminal simultaneously for an interval of time with a portion of the immediately preceding group of the same kind that has been conducted to the output terminal.

SUMMARY OF THE FUEL ELEMENT OF THIS INVENTION

In addition to the surprising discovery here of a method and apparatus for the direct conversion of the kinetic energy of nuclear fission into electrical energy, it has also been discovered that material capable of nuclear fission and having semi-conductor characteristics is useful as a part of a fuel element in a nuclear fission electrical generator, i.e., a reactor adapted to extract electrical energy directly from nuclear fission without the necessity of an intervening thermal stage.

Semi-conductors are known to be useful in the direct, nonthermal conversion of some types of nuclear radiation energy into electrical energy, but these types of radiation are low energy, are altogether different from fission fragments, and are generally of a much lower intensity than the radiation that is released in nuclear fission carried out in a nuclear reactor. Semi-conductor materials have also been used in fission fragment counters to measure discrete fission events occurring within a given time span, but these devices have required substantial inputs of power, and cannot be used for production of electrical power.

The semi-conductor materials discovered for use in the present invention are materials that maintain semi-conductor characteristics in the presence of a fissile (i.e., fissionable) material.

In order for material capable of nuclear fission and having semi-conductor characteristics to be most suitable for use in this invention, it is preferred that it be substantially free of any combination of components constituting a thermocouple.

It has been discovered that organic semi-conductors and particularly solid organic semi-conductors have properties that render them especially suitable for use in extracting the kinetic energy of a nuclear fission event. In particular, it has been surprisingly discovered that semi-conductor materials formed from phthalocyanine have unique properties which render them eminently suitable for utilization in the present invention. For example, the conductivity of metal phthalocyanine compounds depends almost entirely on the skeletal ring structure of the phthalocyanine molecule and not on the metal atom bound therein; thus metals do not dope the crystalline phthalocyanine material to any significant extent. In addition, phthalocyanine is a stable material resistant to high temperature, has an energy gap of about 1.7 ev, and is resistant to the degradation caused by exposure to radiation.

Various embodiments of the nuclear fission electrical generator fuel element of this invention are disclosed. Each embodiment includes a quantity of material capable of nuclear fission and having semi-conductor characteristics, with a first conductor adjacent and in operative electrical connection with a first surface portion of the semi-conductor material, and a second conductor adjacent and in operative electrical connection with a second surface portion of the semi-conductor material, the first and second electrical conductors being separated by an impedance.

Exemplary embodiments of the nuclear fission electrical generator fuel element of this invention include an array of a plurality of fuel elements on a substrate material in which portions of each of the electrical conductors of each individual fuel element lie in the same plane. Another embodiment of this invention contemplates a plurality of such planar arrays of nuclear fission electrical generator fuel elements. Still other embodiments are disclosed.

The individual nuclear fission electrical generator fuel elements of the invention may be connected in series electrical connection or in parallel electrical connection with one another. By the same token, the planar arrays of nuclear fission electrical generator fuel elements may also be connected in series or parallel electrical relationship with each other when supported within the core of the nuclear reactor. Other combinations are possible.

PRODUCTION OF ELECTRON-HOLE PAIRS AND SEPARATION OF THE COMPONENTS THEREOF IN THE METHOD OF THIS INVENTION

To aid in understanding the method of the present invention, the following more detailed description of the process of extracting electrical power directly from a fissionable material is set forth in accordance with the present understanding of the invention.

In the nuclear fission reaction, a fissionable nucleus such as a uranium, plutonium or thorium nuclide is caused to undergo fission upon being subjected to nuclear excitation energy. In many conventional nuclear reactors, the excitation energy is provided by the capture of neutrons, usually slowly moving neutrons known as thermal neutrons. However, other forms of excitation energy may be used, and there are presently in operation nuclear reactors, commonly referred to as "breeder reactors" or "fast breeder reactors" in which the nuclear excitation energy is supplied by fast neutron capture.

As indicated in Table II above, fission fragments resulting from nuclear fission fly off practically instantaneously in opposite directions under the force of coulomb repulsion. The range of movement of a fission fragment encountering matter in its path is restricted by the density of the matter. In a solid material the range of movement is about 1 mil. In the fraction of one billionth of a second time span before the fission fragment has come to rest, it collides with electrons and nuclei present in atoms in its path.

Such collisions cause electrons to be deflected from their physical positions within the crystal lattice of a solid material. The resulting disturbance in the structure of the material usually manifests itself as heat, and the structure of the material is usually affected adversely. The manifestations of these collisions are commonly known as radiation damage or radiation degradation.

When the semi-conductor material of the present invention is located within the range of movement of fission fragments resulting from nuclear fission, charge carriers in the form of "electron-hole pairs" are created within the semi-conductor material by the collision of fission fragments with the semi-conductor material. The two components of such a pair of charge carriers are a negatively charged electron and its opposite member, a positively charged "hole"—which is thus characterized because it is considered as being the absence of an electron.

The mechanism of this process of formation of electron-hole pairs that is generally accepted by those skilled in the art involves a change both in the physical location and in the energy state or energy level of the electrons with which fission fragment collisions take place. These collisions not only change the physical location of orbital electrons, but promote the energy states of these electrons so that they are "knocked out" of their atomic orbitals or molecular orbitals to produce electron-hole pairs.

The terms "atomic orbital" and "molecular orbital" are used here in the conventional sense of defining a particular energy state or energy level of a given orbital electron, not the physical path through which the electron moves. As is also conventional, the terms "collide" and "collision" are used to refer to an encounter between a fission fragment and an electron, between a fission fragment and the nucleus of an atom, or between two electrons, which come into close proximity with each other, even though it must be understood that they merely approach one another and are then repelled or deflected by the electrostatic forces which are exerted by such charges, whether those forces are forces of attraction or repulsion. They do not in fact strike each other physically as happens in the case of a collision between two solid bodies in everyday life.

Electrons that are knocked out of their orbitals by collisions with fission fragments collide with other orbital electrons, referred to as "knock-on" electrons, which are in turn promoted to higher states of kinetic energy and knocked out of their atomic orbitals. A smaller number of "knock-on" electrons may also be produced as a result of collisions of fission fragments with nuclei of the atoms of the semi-conductor material. These collisions, which tend to occur as the movement of the fission fragments slows down, cause the nuclei to be moved from their positions in their atoms to collide with electrons of the semi-conductor material to produce more "knock-down" electrons.

The cumulative interaction of electrons deflected by fission fragment collisions and "knock-on" collisions produces what is commonly called a "cloud" of electron-hole pairs, and is sometimes referred to in this specification as a "group" of such charge carriers.

Whenever reference is made in this specification or in the claims to electrons, holes, electron-hole pairs, or charge carriers "created by," or "produced by," or "resulting from" the collision of fission fragments with semi-conductor material, or with the atomic nuclei or electrons of such material, this includes, unless the contrary clearly appears from the context, all such charge carriers whether they have been produced from the initial fission fragment collisions following immediately after nuclear fission or are produced from the "knock-on" effect thereafter. In other words, the charge carriers created by, produced by or resulting from nuclear fission fragment collisions are considered to include the "first generation" of such carriers, the "second generation" of such carriers, and any later "generations" of charge carriers produced thereafter that result from any displacement of electrons from their atomic or molecular orbitals.

In the method of this invention, immediately after a given fission fragment collision produces a cloud of electron-hole pairs, the electrons and holes which are the two components of such a group are separated from each other. The two components are then moved farther apart, in generally opposite directions within the semi-conductor material, and are finally conducted to respective output terminals that are in operative electrical connection with spaced surface portions of the semi-conductor material. As will be explained in more detail below, these separating, moving apart and conducting steps may be effected through the utilization of one or more charge-affecting fields of force within the semi-conductor material in which the clouds of charge carriers have been created.

The electron-hole pairs created by fission fragment collisions, as indicated, have the form of clouds. During the separation of the electrons and holes of these pairs, it is believed that both the electrons and the holes continue to be organized in the form of clouds. Therefore, the separation is in effect the splitting of one cloud that contains charge carriers of both positive and negative polarities into two clouds, each of which has a single polarity, one positive and one negative. After the splitting of the original cloud of electron-hole pairs, the two resulting clouds are moved apart and conducted, as has been indicated, to their respective output terminals.

It is assumed that the volume occupied by any given cloud or group will usually increase somewhat, and thus the density of the cloud or group will decrease, as the electrons and holes, respectively, resulting from fission fragment collisions are influenced by the one or more charge-affecting fields of force that are utilized in the practice of this invention. Nevertheless, it is believed that as any given cloud or group of charge carriers moves in response to a charge-affecting field or fields of force, it will retain a certain degree of integrity as a fairly distinct collection or aggregation of charge carriers, until each cloud of a particular polarity reaches its respective output terminal and joins there with other similar clouds to produce a net positive yield of electrical power.

DEPLETION OF UNWANTED CHARGE CARRIERS FROM SEMI-CONDUCTOR MATERIAL

In the practice of this invention, the semi-conductor material must be at least partially depleted of charge carriers which are present in the semi-conductor material inherently rather than as a result of fission fragment collisions with the semi-conductor material. There are a number of processes, such as heat excitation, which inherently produce such charge carriers.

The clouds of charge carriers which are intentionally produced from fission fragment collisions in the practice of this invention may be characterized as "useful charge carriers," in contrast to other charge carriers inherently present in the semi-conductor material which, as indicated, are removed therefrom by a depletion step. Unless the semi-conductor is thus depleted, useful electron-hole pairs created in the semi-conductor lattice by fission fragment collisions will combine with charge carriers inherently present in the semi-conductor material, and will thus produce heat and other undesirable effects rather than having their two components separated, moved apart, and conducted in groups to respective output terminals to produce a net positive yield of electrical power.

The unwanted charge carriers inherently present in the semi-conductor material are randomly produced in that material, and over a period of time will tend to fill up the material with a virtual "sea" of charge carriers that are widely dispersed and, for all practical purposes, uniformly distributed throughout the lattice. Thus, even though they are relatively few in total number in comparison with the very large number of electrons or holes in every one of the more or less dense clouds of useful charge carriers that are conducted to output terminals to produce electrical power, these individually produced, unwanted charge carriers can do a great deal of damage—if they are not removed from the lattice—by getting in the way of the moving clouds of useful charge carriers. If a cloud of useful charge carriers collides with one or more unwanted charge carriers, serious damage may be done to the physical integrity of the moving cloud, and that group of useful charge carriers is then unlikely to find its way to the output terminal toward which it was headed, but instead will probably have most of its energy dissipated as heat.

When the initial depletion of unwanted, inherently present charge carriers has been carried out, other such charge carriers that are created thereafter should be depleted in the same way. The charge-affecting field of force by means of which this later depletion is accomplished will not necessarily produce physical movement of the subsequently produced random charge carriers in the same direction and with the same speed as the clouds of useful charge carriers which are separated, moved apart, and conducted to their respective output terminals. The movement of the unwanted charge carriers during such later depletion does not interfere to any significant extent, however, with the desired travel of the clouds of useful charge carriers to the output terminals, because of the tremendous distances within the lattice of the semi-conductor material which separates the physical locations of the charge carriers that are randomly produced in the material from time to time after the initial depletion has largely swept out unwanted carriers from the lattice. These distances are ordinarily of an extremely high order of magnitude in comparison with the approximate diameter of a cloud of useful charge carriers, and the resulting very large open spaces thus make possible the substantially unimpeded movement of clouds of useful charge carriers of their respective output terminals.

Since randomly produced unwanted charge carriers will interfere with the practice of this invention if they are not largely depleted from the semi-conductor material, the question may arise as to why clouds of electrons and clouds of holes themselves that are proceeding in opposite directions toward their respective output terminals do not interfere with each other by colliding and having their energy substantially dissipated in the form of heat. It has been found that such collisions do not occur in practice sufficiently often (unless an exceptionally high current is drawn from a single fuel element) to interfere to any substantial extent with the practice of this invention.

The reason this does not happen lies in the fact that in comparison to the distances between adjacent clouds that are simultaneously present in the semi-conductor material utilized in the practice of this invention, each cloud of charge carriers is a relatively compact aggregation of carriers. It is believed that each cloud may contain as many as about $10^6$ electrons or holes within a volume of space that measures in the order of magnitude of perhaps $2\times10^{-3}$ cm. in diameter, and that for a commerically useful level of power production the clouds will be separated by distances that may be as great as 0.05 cm. or more. The distances separating adjacent clouds of charge carriers are, in other words, at least about 25 times as great as the probable dimension of the individual cloud itself. The relatively dense clouds of charge carriers therefore have a high probability of getting through to their respective output terminals—where each cloud contributes to the production of useful electrical power—without colliding with any clouds of charge carriers of the opposite sign that are moving toward the other output terminal.

The semi-conductor material employed in the practice of this invention can be depleted of unwanted charge carriers by a "charge-affecting field of force" within the semi-conductor material. A single charge-affecting field of force may be employed, or a plurality of charge-affecting fields may be used, to perform this depletion step, as well as to carry out the additional steps of separating and moving apart of clouds of useful charge carriers produced by fission fragment collisions as described above, and then conducting those clouds of useful charge carriers to their respective output terminals.

BRIEF DESCRIPTION OF DRAWINGS

FIG. 5 is a cross sectional view of one embodiment of a planar array of the nuclear fission electrical generator fuel element of this invention;

FIG. 5A is a cross sectional view taken substantially along line 5A—5A of FIG. 5;

FIGS. 5B and 5C are cross sectional views taken substantially along lines 5B—5B and 5C—5C, respectively, of FIG. 5;

FIG. 6 is a cross sectional view of another embodiment of a planar array of the nuclear fission battery fuel element of this invention;

FIGS. 6A and 6B are cross sectional views taken substantially along lines 6A—6A and 6B—6B, respectively of FIG. 6;

FIG. 6C is a cross sectional view of the device of FIG. 6, taken substantially along line 6C—6C of FIG. 6;

FIG. 7 is a cross sectional view of one embodiment of a plurality of planar arrays of the nuclear fission electrical generator fuel element of this invention;

FIG. 8 is a schematic view of a nuclear fission electrical generator fuel element illustrating the utilization of a plurality of charge-affecting fields of force;

FIG. 9 is a schematic view of one embodiment of the apparatus of this invention illustrating the utilization of a charge-affecting field of force comprising a magnetic field;

FIG. 10 is a cross sectional view of one embodiment of the nuclear fission electrical generator fuel element of this invention particularly designed for use in an existing, present-day nuclear reactor; and FIG. 10A is a fragmentary view of a member that may be used to support the fuel element of FIG. 10 in an existing nuclear reactor.

SUITABLE NUCLEAR REACTORS

Figure 1:
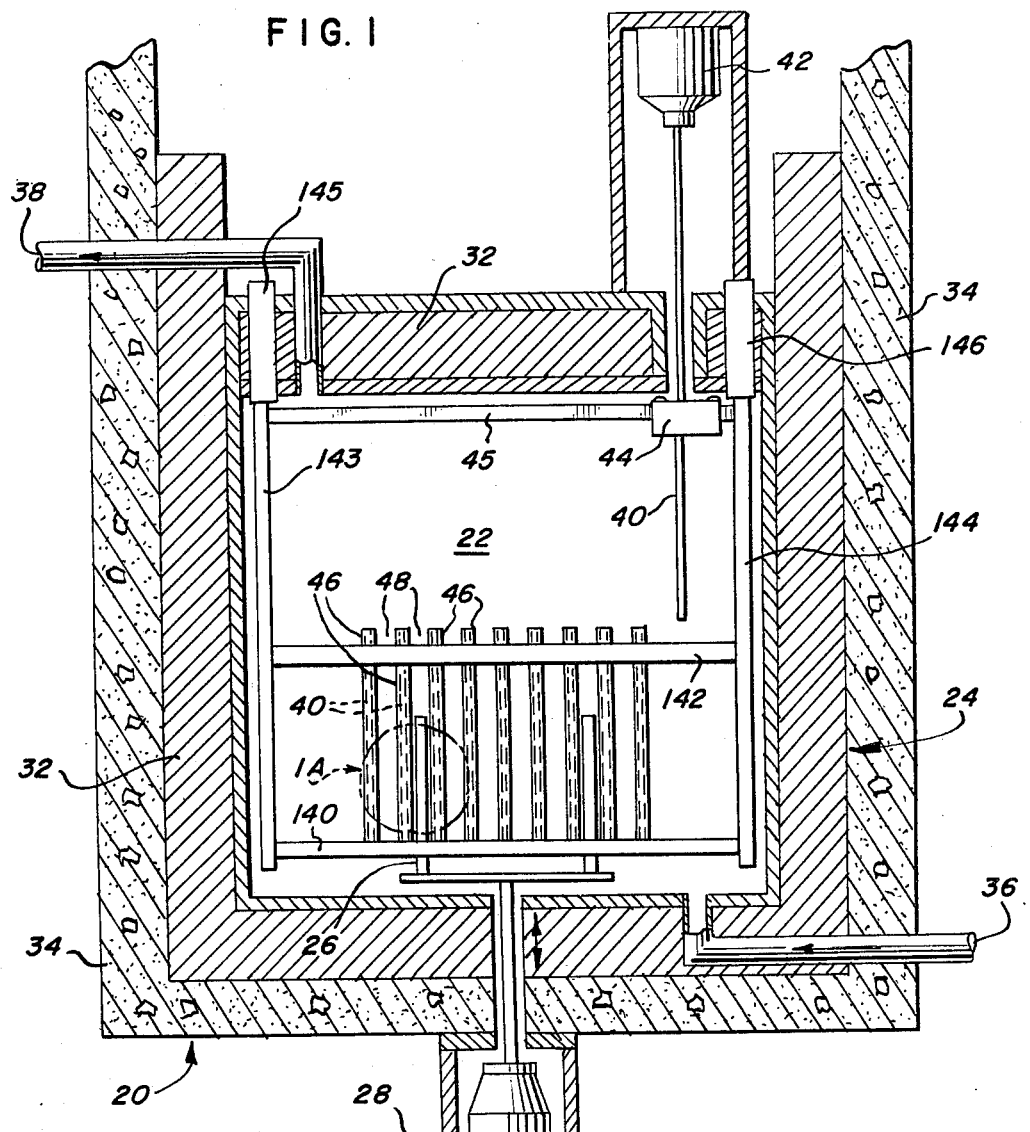
FIG. 1 is a cross sectional view, partly schematic, of one embodiment of a nuclear reactor useful in extracting electrical power in accordance with this invention from a fissionable semi-conductor material without the necessity of an intervening thermal energy stage.

FIG. 1 is a cross sectional view, partly schematic, illustrating one embodiment of a nuclear reactor constructed in accordance with this invention, which may be used to extract electrical power from a fissionable material without the necessity of an intervening thermal energy stage. Nuclear reactor 20 of FIG. 1 is shown and described for illustrative purposes only, to aid in the understanding of the present invention, and the invention is of course not limited thereto. The teachings of this invention can be practiced in various types of nuclear reactors.

Nuclear Excitation Energy

It is necessary in a nuclear fission reactor to subject a material capable of nuclear fission, commonly called a fissile or fissionable material, to nuclear excitation energy to produce the desired fission events. The source of the nuclear excitation energy may be any source of energy which will cause a nucleus to fission. In today's nuclear reactors, the bombardment of a nucleus either by thermal (slow) neutrons or by fast neutrons usually provides the excitation energy to produce nuclear fission.

In nuclear reactor 20, the nuclear excitation energy is provided by thermal neutrons. The thermal neutrons are derived initially from a conventional source of neutrons such as an encapsulated quantity of a mixture of radium and beryllium (not shown), and thereafter from the nuclear fission reaction itself.

To assure that the neutrons will be thermal, or slow, neutrons rather than the fast neutrons originating from the neutron source, their energy must be reduced. In nuclear reactor 20, a supply of moderator material 22 in the form of heavy water is provided within nuclear reactor core 24 to reduce the energy of the neutrons. If desired, light water may be used in place of heavy water in reactor 20, in which case a larger quantity of moderator liquid is required. A suitable organic moderator such as diphenyl may also be employed.

The moderator means may also be solid in form. Suitable moderator materials known to those skilled in the art for use as solid moderator means include carbon, beryllium, etc.

If it is desired to employ fast neutrons as the means of nuclear excitation energy in the nuclear reactor of this invention, the construction of the reactor core, with respect both to the form and arrangement of the elements and the nature of the materials from which they are constructed, must be such as to avoid undue interference with such neutrons. For example, long tubes or fins of uranium clad in zirconium alloys may be employed as the fuel element of the core, with channels for coolant being disposed between adjacent fins if desired. The other elements of the core may also be formed of zirconium or any material that does not unduly moderate or slow down the neutrons. For the same reason, when fast neutrons are utilized, liquid sodium is a suitable substance to use for a coolant.

Control of Neutron Flux.

In any nuclear reactor it is necessary to provide means for controlling the neutron flux in order to maintain a controlled rate of nuclear fission. The rate of nuclear fission in nuclear reactor 20 is controlled by control rods 26. Although here designated as "control rods," these elements may take the form of rods, sheets, or any other suitable shape. In nuclear reactor 20, the control rods have the form of planar sheets.

Control rods 26 may be selectively positioned in the nuclear reactor by automatic control actuator 28 (shown schematically in FIG. 1). The movement of control rods 26 is accompanied by a change in the reactivity of the reactor.

Control rods 26 contain neutron absorbing materials, which may be, for example, cadmium, boron or hafnium materials. A fertile material such as uranium 238 may also be used. As is understood in the nuclear science arts, a "fertile material" is a substance which can be converted into fissionable material by neutron absorption and subsequent decay into a fissionable species.

As shown, the exterior of nuclear reactor core 24 is formed of jacket 32 of a neutron reflecting material which is effective to reduce the ratio of peak neutron flux to the flux at the edge of the core of fuel, and also to reduce the amount of fissionable material required to achieve criticality. Essentially, good moderator materials are also useful as materials from which reflectors may be made. Reflector jacket 32 is formed of beryllium, which is exemplary of a useful neutron reflector material.

The exterior of nuclear reactor 20 is completed by biological shield 34, constructed from concrete, to protect against neutrons and other radiation that would otherwise escape from the reactor. In general, the best shield for neutrons is a low atomic weight material, whereas shielding for gamma rays requires a high atomic weight material. Thus, a biological shield is often made of several layers which are formed alternately of heavy and light material. Shields may be constructed from layers of concrete, steel, lead, polyethylene, a boron compound, or the like. Water channels may also be provided, if desired, between the layers of shielding.

Coolant

As already explained, the present invention extracts electrical power directly from the nuclear fission reaction, without the necessity of an intervening thermal conversion stage. Contrary to the expectations of those skilled in the nuclear science arts, the present invention makes it possible to construct a nuclear reactor that does not lead to the instantaneous conversion of all the kinetic energy of a fission event into heat. According to the teaching of the present invention, a very large portion of the vast kinetic energy of the nuclear fission reaction is directly extracted as electrical energy instead of being converted into heat. Thus the nuclear reactor of the present invention may be operated without the significant heat production that must be present in prior art nuclear reactors.

Operation of the nuclear reactor of this invention may nonetheless result in the production of some amount of heat. For this reason, a coolant may be used to cool reactor core 24, and thereby maintain the nuclear reactor at the desired temperature for the production of electric power. Coolants known to have useful properties in nuclear reactors, such as heavy or light water, liquid sodium, etc., can be used, if desired, with the present invention.

In nuclear reactor 20, moderator material 22 (heavy water) serves also as a coolant. Material 22 is introduced into reactor core 24 through inlet 36, flows through the reactor core, and flows out of the reactor at outlet 38 to be cycled through a heat exchanger and then back into the reactor.

Self-Sustaining Chain Reaction

In the practice of this invention, a quantity of fissionable material is supported in nuclear core 24, where it is subjected to nuclear excitation energy. Once reactor start-up has been accomplished, the usual method for subjecting the fissionable material within reactor 20 to nuclear excitation energy is to maintain a self-sustaining chain reaction in reactor core 24. In such a reaction, the nuclear excitation required for carrying out the method of this invention is provided by the fissionable portion of the fuel material employed.

In order to maintain a self-sustaining nuclear chain reaction, it is necessary to have at least a critical amount of fuel present in the core of the nuclear reactor. The design of reactor 20 must take into account a number of factors such as the size and shape of the reactor core as well as the constituents present within the core. These factors are used to compute the amount of fuel which is required to achieve a self-sustaining chain reaction. The mathematical formulas used in reactor design are familiar to those skilled in the nuclear science arts, and are illustrated in text books such as *Principles of Nuclear Reactor Engineering* by Glasstone (D. Van Nostrand Co., 1955) and *Basic Nuclear Engineering* by Foster et al. (Allyer & Bacon, 1968).

The structural design of the nuclear reactor employed in the practice of this invention (in particular, the form, dimensions and location of the various elements that together make up the core of the reactor) and the materials from which the reactor is constructed, taken together, constitute means for directing fission fragments resulting from nuclear fission into collision with the semi-conductor material supported within the reactor. This is true of the nuclear reactor when it is standing ready to receive the fissionable semi-conductor fuel material to prepare the reactor for operation, and is also true when the fuel material has been installed in place.

SUPPORT MEANS FOR FUEL ELEMENTS

In the operation of the nuclear reactor of this invention, material (1) capable of nuclear fission and (2) having semi-conductor characteristics is supported within the reactor core and subjected there to nuclear excitation energy. In FIG. 1, a quantity of such material is positioned within reactor core 24 as a part of a plurality of planar arrays 40 of individual nuclear fission electrical generator fuel elements, which are to be described in more detail below.

Planar arrays 40 may be inserted or removed by means of automatic refueling device 42 (shown schematically in FIG. 1) without interfering unduly with the operation of the reactor. The fuel element planar array to be inserted is carried to its position in core 24 by automatic positioning device 44 (also shown schematically), which runs along horizontal track 45. A planar array 40 is illustrated at the right-hand side of FIG. 1 in the process of being extracted from the core.

Various means for supporting planar arrays 40 of nuclear fission electrical generator fuel elements within the core may be used. Exemplary of support means are planar sleeves 46, formed of aluminum, which are positioned in the core to receive the planar arrays of nuclear fission electrical generator fuel elements. Open spaces 47 (best seen in FIG. 1A) are provided between each planar sleeve 46 and its associated planar array 40, to permit the array to be slid easily into place and out again when desired.

In the embodiment of the apparatus of this invention shown in FIG. 1, planar sleeves 46 that help from the support structure for immediately adjacent planar arrays form coolant channels 48 between them.

Figure 1A:
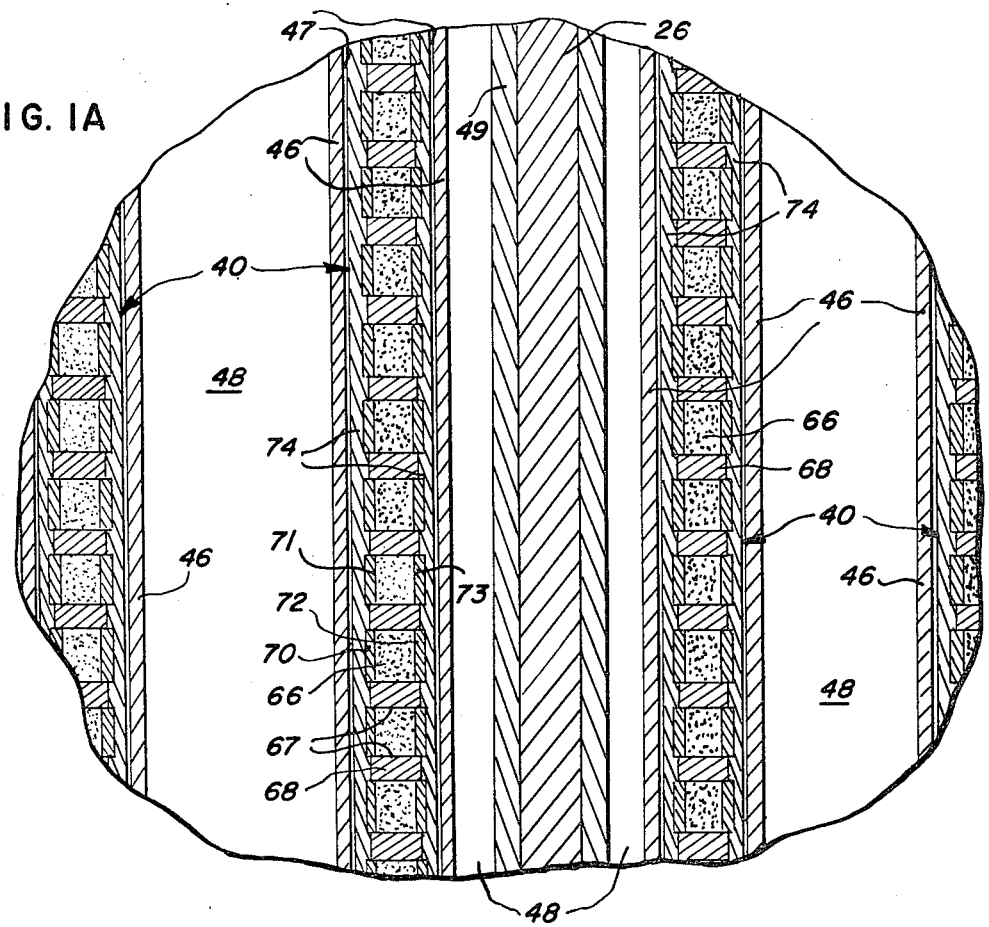
FIG. 1A is an enlarged fragmentary view of a portion of the reactor core of FIG. 1, indicated as portion 1A in that figure.

FIG. 1A is an enlarged, fragmentary, cross sectional view of a portion (indicated as area 1A in FIG. 1) of a plurality of planar arrays 40, each of which is positioned in a support structure comprising sleeve 46. Coolant channels 48 are formed, as already stated, by the two planar sleeves 46 that help to form the support structure for immediately adjacent planar arrays 40.

Also shown in FIG. 1A is a control rod 26, with its protective encapsulation 49. The control rod itself is formed of a neutron absorbing material, cadmium, and its protective encapsulation is formed of aluminum, aluminum oxide or the like. As already indicated, control rod 26 (shown in cross section in FIG. 1A) is planar or sheet-like in its overall shape.

If desired, the planar arrays of nuclear fission electrical generator fuel elements in nuclear reactor 20 may be supported on guide rails or the like. The particular structure of the support means for planar arrays 40 is not critical, so long as the material having semi-conductor characteristics is maintained in the path of and within the range of fission fragments that emanate from the fissionable material. With the semi-conductor material thus positioned, the collision of fission fragments therewith produces the electron-hole pairs which are required for the practice of this invention.

The support means (such as sleeves 46) for the planar arrays of nuclear fission electrical generator fuel elements may be made out of any material that will not undesirably interfere with nuclear fission reactions. Exemplary of suitable structural materials are aluminum, zirconium, stainless steel, and alloys thereof.

MATERIAL OF WHICH NUCLEAR FISSION ELECTRICAL GENERATOR FUEL ELEMENTS ARE FORMED

Figure 2:
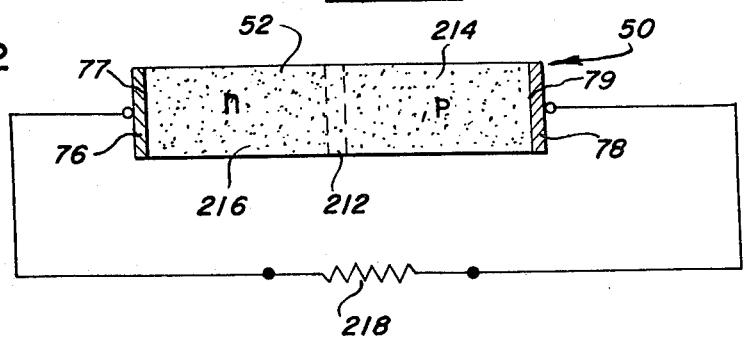
FIG. 2 is a cross sectional view of one embodiment of the nuclear fission electrical generator fuel element of this invention which illustrates a fuel element having a p-n junction within the element.

FIG. 2 is a cross sectional view showing one embodiment of a single nuclear fission electrical generator fuel element 50. Nuclear fission electrical generator fuel element 50 is formed in part of a quantity of material 52 capable of nuclear fission and having semi-conductor characteristics.

Single Chemical Substance or Two Distinct Substances

The term "material capable of nuclear fission and having semi-conductor characteristics" is used in this specification and in the claims to describe (1) a single chemical substance that has semi-conductor characteristics and includes a fissionable constituent, or (2) a material which is not a single substance but distinct chemical substances that comprise a fissionable material and a semi-conductor material, respectively.

In the second case just mentioned, the semi-conductor material must retain at least some semi-conductor characteristics in the presence of the fissionable material. The semi-conductor material may be more or less "doped" by the presence of the fissionable material, but its conductivity must not be increased by the doping to such an extent that the material no longer falls within the customary definition of a semi-conductor material.

Uranium 235 phthalocyanine is illustrative of a fuel material for use in the apparatus and method of this invention that is a single chemical compound having semi-conductor characteristics and also having a fissionable constituent. The fuel material 52 of nuclear fission electrical generator fuel element 50 shown in FIG. 2 is uranium 235 phthalocyanine.

Chemical Nature of Fuel Material

Both the chemical nature and physical form of the material capable of nuclear fission and having semi-conductor characteristics may be widely varied in accordance with the teachings of the present invention.

The material capable of nuclear fission that is employed in the practice of this invention may be any fissionable material useful as a fuel in a nuclear reactor. Fissionable materials useful in nuclear reactors are exemplified by the fissionable fuels such as uranium, plutonium, thorium, etc.

The broad range of fissile materials which are conventionally used in nuclear reactors are useful in the present invention. Suitable nuclides which are capable of undergoing fission are $U^{233}$, $U^{235}$, $Pu^{239}$, $Pu^{241}$, $Th^{232}$, and various alloys of these fissionable nuclides.

It has now been surprisingly discovered that semi-conductors comprising phthalocyanine compounds having a fissionable constituent are suitable for use as the semi-conductor material of the present invention. While it is known that some organic compounds possess enhanced conductivity properties, the utilization of these materials in the nuclear arts has not heretofore been fully accepted by those familiar with the nuclear science fields. For instance, J. M. Taylor, in *Semiconductor Particle Detectors* (Butterworths Inc., 1963), reports that the results are discouraging for those organic semi-conductors that have been investigated.

The fissionable constituent of the phthalocyanine semi-conductor material may be any metal capable of undergoing fission, such as the fissionable nuclides of uranium, thorium and plutonium. It is necessary that the process used to manufacture semi-conductors for this invention be carefully controlled, in order to avoid defects which will cause undesirable effects such as trapping. A process for forming metal phthalocyanine and particularly phthalocyanine compounds containing a fissionable metal such as a uranium nuclide is described in U.S. Pat. No. 3,027,391.

One example of a fissionable, semi-conductive material suitable for use in this invention is uranium phthalocyanine. The material may be, for example, uranium (IV) bis-phthalocyanine or uranyl phthalocyanine. Other suitable materials include thorium (IV) bis-phthalocyanine, thoranyl phthalocyanine, plutonium (IV) bis-phthalocyanine, and plutonyl phthalocyanine.

Even non-fissionable metals such as copper may be employed as one constituent of the metal phthalocyanine semi-conductor material if a separate fissionable material is used in conjunction therewith as a source of fission fragments.

In addition to phthalocyanine compounds, other organic semi-conductor materials may be employed in practicing this invention. Exemplary organic semi-conductor materials that are suitable are naphthalene, anthracene, coronene, magdalen red, safranine, thionine, methylene blue, p-phenylenediamine-chloranil, pyranthrene, hexacene and naphthacene.

Inorganic semi-conductor devices may also be used in practicing the instant invention. Inorganic semi-conductors such as germanium, silicon, cadmium sulfide, etc., are exemplary of such devices. Intermetallic semi-conductor compounds such as indium antimonide may also be used.

Fissionable nuclides such as plutonium 239, uranium 233, or thorium 232 are suitable for use in reactors employing the capture reaction of fast neutrons as the source of nuclear excitation energy. These materials have been suggested for use in the improved "breeder reactors" or "fast breeder reactors" which have been proposed by a number of persons working in this field.

It is possible to produce electrical power in breeder reactors or fast breeder reactors in accordance with the present invention, since as already noted in the source of nuclear excitation energy is not critical, and either thermal neutrons or fast neutrons may be used in practicing this invention, depending on the particular nuclear unit design employed.

Physical Form of Fuel Material

If desired, the fissionable material and semi-conductor material for use with this invention may be in separate and distinct forms, such as a laminate comprising at least one thin sheet of semi-conductor material and at least one thin sheet of a fissionable material.

Figure 3A:
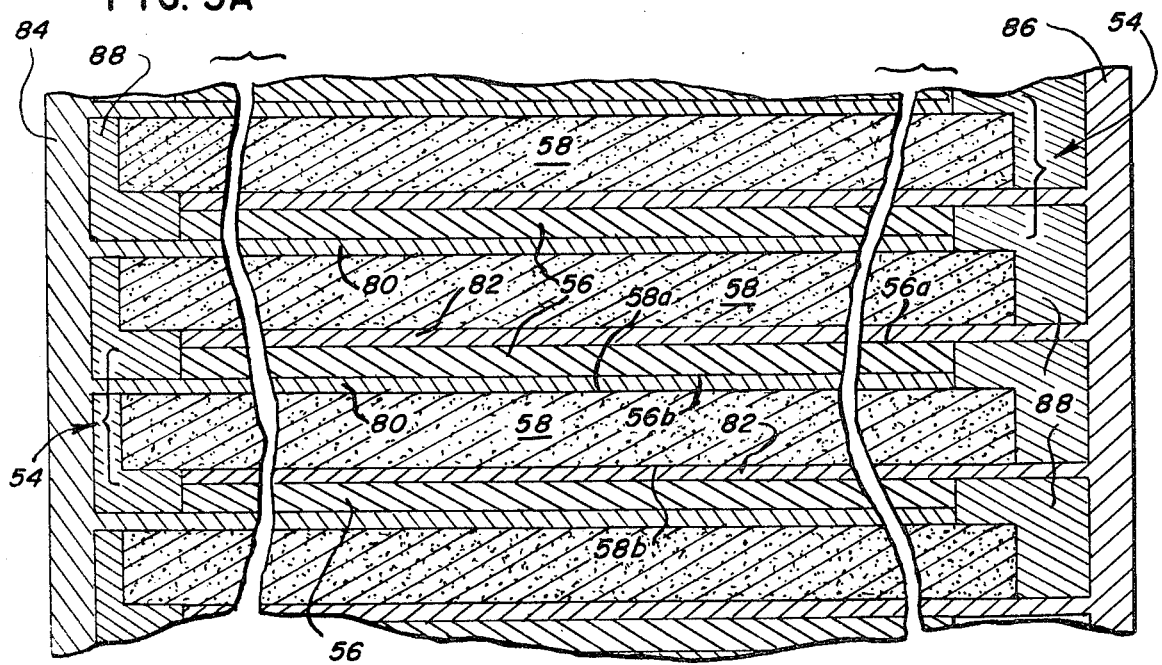
FIG. 3A is a cross sectional view of another embodiment of the nuclear fission electrical generator fuel element of this invention in the form of a laminate.

FIG. 3A is a cross sectional view of several nuclear fission electrical generator fuel elements 54 in which the material capable of undergoing nuclear fission and having semi-conductor characteristics is in the form of a laminate. The laminate in each fuel element 54 comprises relatively thin layers of a fissile material 56 (a high resistivity oxide of uranium 235) and relatively thin layers of a semi-conductor material 58 (silicon).

In the embodiment of FIG. 3A, each of the layers just referred to is separated from adjacent layers by a conductor. The fissionable material and the semi-conductor material must of course be located so that fission fragments from the fission events collide with the semi-conductor material. In addition, passage of the fission fragments from fissionable material 56 to semi-conductor material 58 must not be impeded to too great a degree by the conductors on either side of the fissionable material. Fission fragments from a given fissionable material 56 may collide with immediately adjacent layers 58 of semi-conductor material, or may pass through those layers to collide with a more remote layer 58, to produce the electronhole pairs that are utilized in the practice of this invention.

The material capable of nuclear fission and having semi-conductor characteristics that comprises fuel element 54 maybe considered to include a laminate of fissionable material 56 and semi-conductor material 58 or the reverse, as indicated by the designator numeral 54 on either side of FIG. 3A.

Figure 3B:
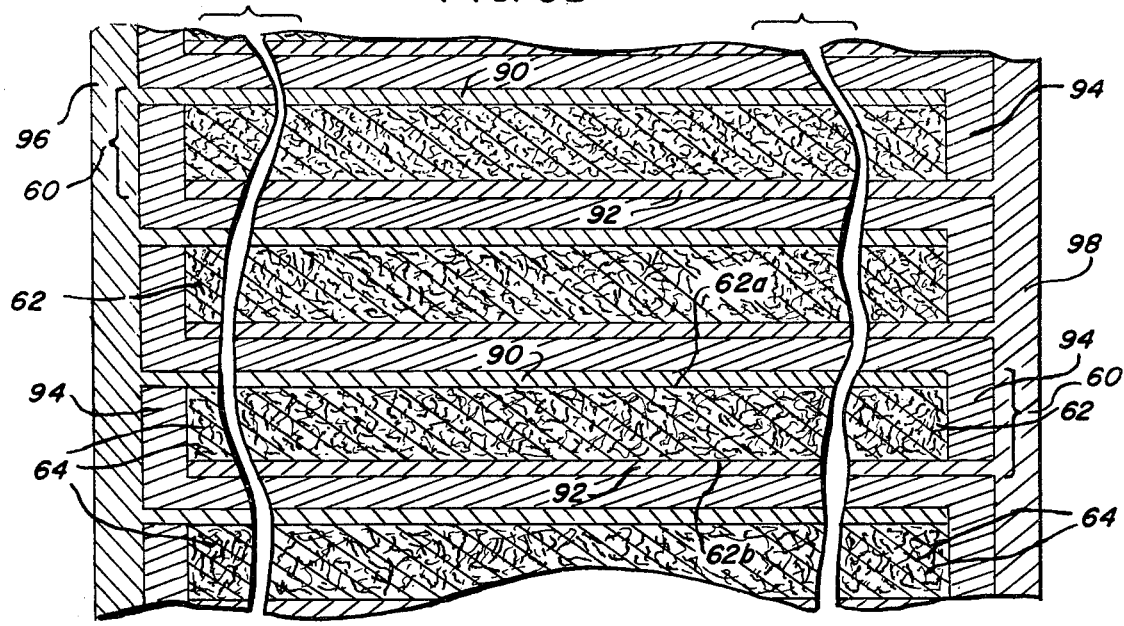
FIG. 3B is a cross sectional view of still another embodiment of the nuclear fission electrical generator fuel element of this invention in which fissionable material in the form of finely divided particles is embedded in a semi-conductor material.

The semi-conductor material may also be in the form of a composite or mixture having separate and distinct fissionable components and semi-conductor components, with the former usually in the form of finely divided particles. FIG. 3B illustrates such a nuclear fission electrical generator fuel element 60, in which the fuel material is comprised of semi-conductor material 62 having finely divided particles of fissionable material 64 dispersed therein.

In FIG. 3B, the semi-conductor material is crystalline phthalocyanine, and the fissionable material is uranium 235 in the form of whiskers or short fibers which are dispersed throughout the semi-conductor material. The dispersed particles of fissionable material may, if desired, be in the form of microplates, flakes, microspheres, or any other suitable shape.

The radial dimension of the whiskers of fissionable material should be very much less than the range of movement of the fission fragments, with the length of the fibers being many times their radius. The thickness of microplates or flakes of fissionable material should also be very much less than the range of movement of the fission fragments. Likewise, the radial dimensions of microspheres of fissionable material should be less than that range.

It is also possible to form a mixture of material capable of nuclear fission and having semi-conductor characteristics, such as uranium phthalocyanine, with a matrix material such as ceramic.

If desired, the fissionable metal phthalocyanine semi-conductor material may be in the form of a single crystal. Or it may take the form of a plurality of crystals. In either case, the semi-conductor constituent of the material may have the alpha, beta, gamma, or other crystalline modification, as desired.

The fissionable metal phthalocyanine semi-conductor compounds may suitably be in film form. Films of the fissionable metal phthalocyanine may be self-supporting, or the fissionable phthalocyanine semi-conductor compounds may be supported on the external surface of a self-supporting substrate. Semi-conductor fissionable metal phthalocyanine films suitable for use in the present invention have a thickness from about 100 Angstroms or less to about 10 mils or more. When the film is thus supported upon a substrate, it is preferred that it be produced in place upon the substrate, in a manner known to those skilled in the art.

Substrate for Film of Fuel Material

The substrate upon which a film is fissionable metal phthalocyanine semi-conductor is supported should be a rigid, solid material. The term "solid," as used in this specification and claims with reference to a substrate material on which a film of fissionable, semi-conductor metal phthalocyanine is supported, does not include a supercooled liquid such as glass. This is for the reason that a supercooled liquid has no long range order in its atomic arrangement, and therefore cannot bring about the desired ordering effect in the crystalline film when the film is formed in place upon the same substrate by which it is supported.

Water present on the surface of the substrate or absorbed into the mass of the substrate would interfere with the proper formation of the film of fissionable metal phthalocyanine on the substrate. Even water present in a substrate as water of crystallization would destroy the crystalline structure of the film of fissionable metal phthalocyanine carried by the substrate when that water was driven off by use of the semi-conductor at temperatures, such as 150 degrees C. or higher, at which the semi-conductor is intended to be used. Hence the substrate must be substantially free of water.

The substrate upon which the film of fissionable metal phthalocyanine is supported may be either an electrical conductor or an electrical insulator, depending on the desired functions of the substrate. Substrates wherein the electrical conductor is made from aluminum, zirconium or alloys of these materials are particularly suitable for use in nuclear reactors. In those cases where the substrate is chosen to be an electrical insulator, material such as aluminum oxide, zirconium oxide, beryllium oxide or mixtures thereof may be utilized.

Whether a conductor or an insulator is desired for the substrate material, one skilled in the art will recognize that many factors should be kept in mind in choosing a particular substrate material. Thus the material should be chosen to have the properties (not listed in any necessary order of importance) set forth below. To produce the best results, the substrate should:

(1) Be capable of existing in states of extremely high purity, both in the form of the bulk substrate material and of the external surface whereon the film is to be formed;

(2) Be capable of withstanding cleaning techniques such as electron bombardment;

(3) Have suitable chemical composition so as not to decompose, recrystallize, or otherwise be modified under the conditions of film formation;

(4) Have a suitable crystalline state—single crystal form or polycrystal form;

(5) Have freedom from materials (usually impurities) that would "dope" the semi-conductor in unwanted ways;

(6) Have a high degree of crystalline perfection so that crystal defects will not alter the properties of the film in use;

(7) Permit the desired form of crystal growth within the supported semi-conductor film when the film is produced in place upon the substrate, including among other things the proper crystal form and atomic spacing, as well as the proper crystalline axis orientation to the surface of the substrate single crystal so as to impart desired crystalline axis orientation in the film upon formation at the surface of the substrate;

(8) Exhibit compatability with the doping material(s) used to control the resistivity and carried type (p-type or n-type) in the film;

(9) Exhibit compatability with the gases present within the film formation apparatus;

(10) Have and maintain physical properties suitable for remote handling in the automated apparatus usually used in film formation;

(11) If the substrate is to be used in a fuel element in a nuclear power reactor, be compatible with the extreme conditions found in such reactors, including exhibiting resistance to radiation damage and a low probability of transformation into undesirable nuclides under exposure to the neutron flux of the nuclear reactor core;

(12) Have stable thermal properties in order to aid in the removal of any heat that might be formed within the film;

(13) Have suitably high thermal conductivity to aid to the extent necessary in the removal of any heat that may be formed within the film both in film formation and in subsequent use;

(14) Have the desired degree of electrical conductivity so as not to modify the electrical properties of the film while in use;

(15) Lack the property of polarization and charge trapping or charge retention under conditions of use;

(16) Be free of unwanted electrical surface states;

(17) Have an appropriate work function;

(18) Have desirable magnetic properties so that, if magnetic fields are present, the properties of the film are not modified in an unwanted way, nor unwanted stresses produced, nor physical motions or vibrations or other effects caused as a result of reactions to the magnetic fields that may be present in use;

(19) Be easy and cheap to make; and

(20) Use sufficiently inexpensive raw materials.

These characteristics of the substrate just listed are desirable because when the substrate material is once chosen, it may take an active role in both (1) the formation of the film of semi-conductor; and (2) the subsequent use of the fuel element. Thus, for example, in the formation of the semi-conductor film in place upon the substrate, in order to achieve the desired crystal axis orientation in the supported film, it is desirable to select a substrate material having an appropriate crystal form, atomic spacing and crystal axis orientation within the substrate. Similarly, in the use phase of the life of the substrate, various considerations will affect the selection of an appropriate substrate material.

When an insulator or non-conductor is desired, the substrate should be chosen to have extremely high resistivity. A resistivity of about $10^{15}$ ohm-cms. is suitable. A resistivity of about $10^{18}$ ohm-cms. provides improved results, with practically zero leakage current. An infinite resistivity would of course be the ideal case, and thus it is preferred that the resistivity of the substrate insulator be as high as possible.

In the case of a conductor substrate, extremely low resistivity is desirable. A value of about $10^{31.4}$ ohm-cms. provides suitable results. Improved results are obtained when the conductor substrate has a resistivity of about $10^{31.5}$ ohm-cms. A value of about $10^{31.6}$ ohm-cms. can be obtained with proper choice of a conductor substrate, and is preferred.

If a metal substrate is desired, it is not just any metal that will provide best results for either the film preparation phase of the use phase of the substrate's function. This is because, as indicated above, in film preparation the matter of atomic spacing as well as other characteristics of the material should be considered. And in the same way a number of properties of the conductor substrate should be taken into account in considering the effect particular substrates will have during the use of the supported semi-conductor film.

Other Properties of Semi-Conductor Material

To be useful in the practice of the present invention, a semi-conductor material must possess certain properties and characteristics.

Thus, for example, to collect charge carriers (i.e., electrons and holes) created by fission fragment collision with a semi-conductor material, the semi-conductor must have an adequate minority carrier lifetime. It is presently believed that the minority carrier lifetime of a semi-conductor material determines whether electron-hole pairs are present for a sufficiently long period of time that they can be separated and moved in generally opposite directions, and finally conducted to output terminals. The minority carrier lifetime of a semi-conductor material is dependent on the purity of the semi-conductor structure. Defects and impurities in the structure of the semi-conductor limit the minority carrier lifetime and contribute to an accelerated rate of radiation damage.

Semi-conductor material useful in the present invention should have characteristics which enable it to withstand the degradative effect of radiation bombardment. The material should have a high density of electrons, high mobility of electrons and holes, and good resistance to the elevated temperature that may be found within the core of a nuclear reactor.

It has been found that semi-conductors having an energy gap in the range of from about 0.1 ev (electron volts) to about 10 ev, or even in a wider range, are useful in the present invention. More suitable are those semi-conductor materials that have an energy ap of about 0.25 ev to about 3 ev. Semi-conductor materials having an energy gap of from about 0.5 eve to about 2 ev are still more suitable, and those semi-conductors having an energy gap of from about 0.75 ev to about 1.5 ev are the most preferable materials for use in carrying out this invention.

The semi-conductor material useful with this invention must also have a resistivity that is neither too high nor too low. If the resistivity of the material is too high, the charge-affecting field of force required for depletion from the material of randomly produced, unwanted charge carriers will be excessively large. If the resistivity of the material is too low, the material will be too highly conductive to permit depletion of unwanted charge carriers.

The resistivity of the semi-conductor material employed in the practice of this invention may be controlled by "doping" methods and techniques well known in the art. The precise type of doping substance and doping technique used will depend upon whether the semi-conductor material being doped is an organic or inorganic material.

Those skilled in the art will recognize that in order for the semi-conductor material to be useful in the present invention, it must possess certain characteristic properties that either remain substantially constant or vary in known and controlled ways when in use. Such properties include, among other properties, conductivity (the reciprocal of resistivity), carrier mobility, carrier type, thermal conductivity, resistance to radiation damage, density, and level of physical stress. It is not acceptable for the semi-conductor to exhibit random or uncontrolled values of such characteristic properties of the materials. Furthermore, the properties must not vary in unwanted ways when environmental conditions fluctuate under normal use.

For example, when the temperature changes, as is anticipated under normal use, the semi-conductor must retain its integrity and not assume values of the characteristic properties in question that fall outside the desired ranges. Another example of an unacceptable semi-conductor material would be any semi-conductor that radically changed its properties in unwanted ways when subjected to bombardment by radiation fields (for example, neutron, alpha, beta or gamma radiation) normally present under the intended use. In particular, the conductivity of the semi-conductor material should not vary over an extremely large range when the intensity of radiation varies widely. The preferred case would be for the conductivity to remain constant, or nearly so, as the radiation intensity varies under normal use conditions.

Certain materials known to those skilled in the art, such as phosphorus nitride in combination with certain olefinic polymers, have conductivities that are quite sensitive to any radiation fields present. As one example, Adany U.S. Pat. No. 3,249,830 shows that the conductivity of the phosphorous nitride-olefinic polymer combinations there disclosed can vary be a very large factor for quite small changes in bombardment radiation intensity. Such material would have no use in the semiconductor material of the present invention. Consequently one practicing the present invention should avoid phosphorus nitride and derivatives of the same, as well as any other material that would prevent the maintenance of substantially uniform conductivity under the intended operating conditions under which the semiconductor is to be used.

The nature of the conductivity of particular regions of the semi-conductor material—either p-type or n-type—may also be controlled by known techniques of doping. The control of this aspect of the semi-conductor material is important for a purpose to be more fully explained below.

The film of fissionable semi-conductive material phthalocyanine may have a crystal axis orientation such that the plane of the phthalocyanine molecule is oriented substantially normal to the surface of the substrate. This crystal axis orientation of the metal phthalocyanine with respect to the substrate surface is especially useful if the conductivity of the semi-conductive material is controlled by the above mentioned methods of "doping" to provide a highly conductive pathway substantially in the plane of the film, and the charge collection electrodes are arranged on a single surface of the semi-conductive film.

If desired, the fissionable semi-conductive metal phthalocyanine may have a crystal axis orientation such that the plane of the phthalocyanine molecule is either tilted at an acute angle with respect to the surface of the substrate, or is disposed substantially parallel to that surface. The parallel orientation is especially useful if the charge collection electrodes are arranged on opposite surfaces of the film. The acute angle orientation will be useful for other arrangements of charge collection electrodes in those cases where conductivity variations throughout the volume of the semi-conductive film are useful for the depletion of the semi-conductor of unwanted charge carriers.

For best results the film of fissionable, semi-conductive metal phthalocyanine useful in this invention should be substantially free of microscopic voids throughout its structure, or in other words should be substantially continuous in form. Voids, like other imperfections in the crystalline film, will degrade the electrical properties of the film. A film substantially free of voids of more than about 50 Angstroms in maximum transverse dimension is suitable, while a film substantially free of voids of greater than about 40 Angstroms size provides improved results. A film having substantially no holes larger than about 30 Angstroms is preferred.

In addition, in order to achieve the desired uniformity within the film of fissionable, semi-conductive metal phthalocyanine, the film should be substantially free of water, and preferably substantially free also of other solvents. Water and othe solvents, especially if present in varying amounts, modify the electrical properties of the supported film in an uncontrolled manner.

The synergism indicated between the substrate and the supported semi-conductor film makes the choice of the pair very important. The substrate does much more than support the film. It participates in the formation of any film that is produced in place on the substrate and, at a later time, it participates in the function or use of the film.

In order to achieve the desired electrical and physical properties of the improved semi-conductor of this invention, the substrate must be chosen with care for, as has been indicated above, the substrate crystal structure, atomic spacing and crystal orientation induce a particular crystal structure and molecular orientation within the film. In the practice of this invention, one skilled in the art may follow the above indicated guide lines to select in each case the substrate and the semi-conductor film that will provide the best combination of characteristics for the particular situation involved.

As pointed out above, the semi-conductor material employed in the present invention is preferably substantially free of any components constituting a thermocouple.

STRUCTURE OF INDIVIDUAL FUEL ELEMENTS

Each nuclear fission electrical generator fuel element of this invention includes, as just described, a quantity of material capable of nuclear fission, having semi-conductor characteristics, and preferably substantially free of any combination of components constituting a thermocouple. In addition, it includes a first conductor adjacent and in operative electrical connection with a first surface portion of the semi-conductor material and a second conductor adjacent and in operative electrical connection with a second surface portion of the semi-conductor material. The first and second conductors are separated by an impedance, which may be provided by a solid insulating member or by a liquid or gaseous dielectric material.

In the individual fuel elements that make up planar arrays 40 in FIG. 1A, wafers 66 are formed of the fissionable semi-conductor material uranium 235 phthalocyanine. Wafers 66 are supported in windows 67 dispersed throughout insulating support plane 68, formed of beryllium oxide. Support plane 68 is seen in cross section in FIG. 1A. Each fuel element includes first conductor 70 adjacent and in operative electrical connection with a first surface portion 71 of wafer 66, and a second conductor 72 adjacent and in operative electrical connection with a second surface portion 73 of wafer 66. Conductors 70 and 72 are formed of aluminum.

As indicated, wafers 66 are positioned in windows 67 of insulating support plane 68. Together with conductors 70 and 72 on opposite sides thereof, which conductors are separated by the impedance of support member 68, the wafers and their support member are encased in insulating encapsulating members 74. Members 74 are formed of aluminum oxide. This entire assemblage of wafers and associated elements comprises planar array 40, which is positioned in and supported by sleeve 46.

In fuel element 50 illustrated in FIG. 2, a quantity of fuel material 52, uranium 235 phthalocyanine, has first conductor 76 adjacent and in operative electrical connection with a first surface portion 77 thereof, and second conductor 78 adjacent and in operative electrical connection with a second surface portion 79 thereof.

Fuel element 54 shown in FIG. 3A includes layers of fissionable material 56 and semi-conductor material 58 which are distinct chemical substances, with the latter material retaining semi-conductor characteristics in the presence of the former material. In the fuel element indicated by designator numeral 54 at the left-hand side of FIG. 3A, the body of fuel material has four major surfaces. These are surface portion 56a at the top of fissionable layer 56, surface portion 56b at the bottom of that layer, surface portion 58a at the top of semi-conductor layer 58, and surface portion 58b at the bottom of layer 58. First conductor 80 is adjacent and in operative electrical connection with top surface portion 58a of layer 58. Second conductor 82 is adjacent and in operative electrical connection with bottom surface portion 58b of layer 58.

Respective conductors 80 of adjacent fuel elements 54 are electrically connected with bus bar 84, and conductors 82 are electrically connected with bus bar 86. First conductor 80 and second conductor 82 of each fuel element 54 are separated by the impedance of electrical insulators 88.

Similarly, layer of fuel material 62,64 of fuel element 60 shown in FIG. 3B has a first conductor 90 adjacent and in operative electrical connection with top surface portion 62a of semi-conductor material 62, and a second conductor 92 adjacent and in operative electrical connection with bottom surface portion 62b of the semi-conductor material.

First conductors 90 are electrically connected with bus bar 96 on the left-hand side of FIG. 3B, and second conductors 92 are electrically connected with bus bar 98 on the right-hand side of that figure. First conductor 90 and second conductor 92 are separated by the impedance of insulating member 94.

Figure 4:
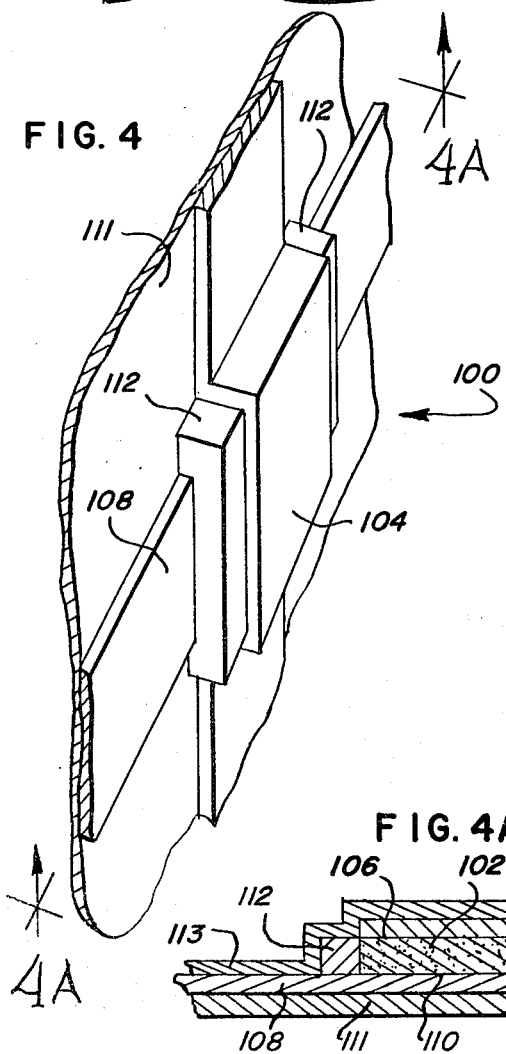
FIG. 4 is a perspective view of another embodiment of the nuclear fission electrical generator fuel element of this invention that may be incorporated in a planar array of similar nuclear fission electrical generator fuel elements.
Figure 4B:
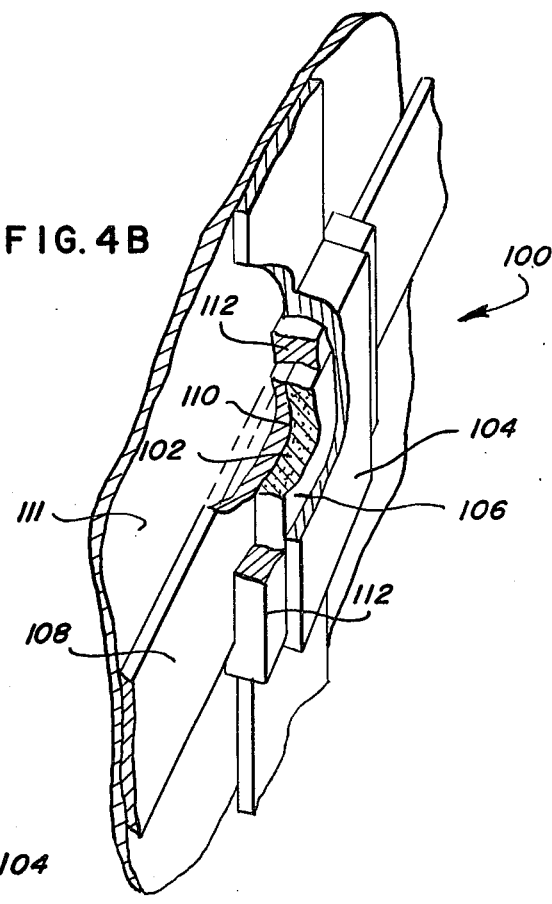
FIG. 4B is a perspective view, partly broken away, of the nuclear fission electrical generator fuel element of FIG. 4.
Figure 4A:
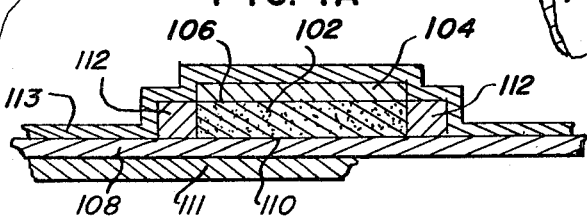
FIG. 4A is a cross sectional view of the nuclear fission electrical generator fuel element of FIG. 4 taken substantially along line 4A—4A of FIG. 4.

Turning now to FIGS. 4, 4A and 4B, which show another embodiment 100 of a nuclear fission electrical generator fuel element in accordance with this invention, wafer 102 of fissionable semi-conductor fuel material is formed of uranium 235 phthalocyanine. First electrical conductor 104 is adjacent and in operative electrical connection with top surface portion 106 of fuel material 102. Second conductor 108 is adjacent and in operative electrical connection with bottom surface portion 110 of fuel material 102.

As is seen in FIGS. 4, 4A and 4B, in this embodiment of the fuel element of this invention portions of the two conductors 104 and 108 lie in the same plane, and are supported on insulating substrate 111. Conductors 104 and 108 are separated by the impedance of insulating spacing members 112. The various components of fuel element 100 are encapsulated between insulating substrate 111 and insulating member 113 (omitted for clarity from FIGS. 4 and 4B).

All the first and second conductors just described in connection with FIGS. 1A, 2, 3A, 3B, 4, 4A and 4B—such as, for example, conductors 70 and 72 in FIG. 1A—are the output terminals to which groups of electron and groups of holes, respectively, are conducted in the practice of the method of this invention.

Output terminals 70, 72, 76, 78, 80, 82, 90, 92, 104 and 108 as shown in various figures of the drawing form ohmic contacts with the semi-conductor material of the respective fuel elements of which they are a part. It is also possible to connect the output terminals to the semi-conductor material by rectifying contacts.

Hence, the electrical conductors serving as output terminals are chosen to form an ohmic contact or a rectifying contact with the semi-conductor material of the nuclear fission electrical generator fuel element of this invention. It is believed that the work function of the electrical conductor plays the major role in determining the nature of the electrical contact, ohmic or rectifying, but treatment steps such as annealing at elevated temperatures for a period of time are often used to remove unwanted surface states which change the nature of the contact. Aluminum is a suitable electrical conductor when an ohmic contact is desired.

The electrical conductors utilized as output terminals in the nuclear fission electrical generator fuel element of this invention should be resistant to radiation damage, should not substantially affect the neutron flux in the reactor core, and preferably should be made of materials which will not become radioactive under the effect of neutron or other radiation. The conductors should suitably have high strength for their weight. The conductors should of course have satisfactory electrical conductivity to perform their function.

Electrical insulators employed in the practice of this invention, such as support plane 68 and encapsulating members 74 shown in FIG. 1A, should be able to resist radiation degradation, should not undesirably decrease the neutron flux in the reactor core, and should preferably not become radioactive under the effect of radiation. The electrical insulators should of course have good electrical insulation properties. Examples of suitable materials include aluminum oxide, beryllium oxide, and the like.

PLANAR ARRAYS OF FUEL ELEMENTS

For convenience in construction and use, a plurality of nuclear fission electrical generator fuel elements may be arrayed in planar relationship and in electrical interconnection with each other.

Thick Crystals of Fuel Material

FIGS. 5 through 5C illustrate a planar array 114 that includes four nuclear fission electrical generator fuel elements. Each fuel element includes a wafer 116 formed of a fissionable semi-conductor material, uranium phthalocyanine. As indicated by FIGS. 5 and 5A, the wafers are supported in windows 118 positioned throughout insulating support member 120.

Each wafer 116 is approximately 1 cm. in thickness, and is essentially a single crystal. Although the preparation of a single crystal of uranium phthalocyanine of the indicated thickness requires extreme care, the relatively large size of the resulting wafer of fissionable material is useful in helping to provide a sufficient quantity of fission fragments for the successful practice of this invention.

Insulating covers 122 and 124 are illustrated in FIGS. 5B and 5C, respectively. (These two figures also indicate, by lines 5—5, the approximate location of the cross section of planar array 114 that is illustrated in FIG. 5). Electrical conductor 126 is embedded in the inner surface portion 128 of insulating cover 122, and is adjacent and in operative electrical connection with a first portion 130 of each wafer 116 through treated contact areas 132 of the conductor. Contact areas 132 are formed of gold; if desired, they may be formed of platinum or other suitable material.

A similar electrical conductor 134 is embedded in the inner surface portion 136 of insulating cover 124, to provide an operative electrical connection with second surface portion 140 of each wafer 116 through treated contact areas 138 of the conductor.

Electrical conductors 126 and 134 on the inner surface portions of insulating covers 122 and 124, respectively, may, if desired, be printed circuits. Various techniques such as acid etching are known for printing a circuit on an insulating material. Insulating covers 122 and 124 are preferably formed of a material that is a good heat conductor, such as beryllium oxide, in order effectively to transfer to the coolant circulating through the nuclear reactor any heat which may be produced by the nuclear fission events.

Suitably electrical conductors 126 and 134 may terminate in a region along an edge of the cover. If a planar array similar to but larger than the planar array 114 of nuclear fission electrical generator fuel elements shown in FIG. 5 is supported within the core of reactor 20 shown in FIG. 1, cooperating electrical conductor elements (not shown) carried by frame elements 140 and 142 may be used to connect conductors 126 and 134 through bus bars 143 and 144 with appropriate electrical terminals 145 and 146 within the reactor core.

In embodiment 114 of a planar array of nuclear fission electrical generator fuel elements shown in FIGS. 5 through 5C, the fuel elements are all connected in parallel. This type of connection increases the magnitude of the electrical current provided by the apparatus of this invention.

FIGS. 6 through 6C illustrate a planar array 148 that includes twenty individual nuclear fission electrical generator fuel elements. Each fuel element includes a wafer 150 formed of a fissionable semi-conductor material, uranium phthalocyanine. The wafers are supported in windows 152 positioned throughout insulating support members 154.

Each wafer 150 is approximately 0.75 cm. in thickness, and is essentially a single crystal. As with the embodiment of FIGS. 5 through 5C, the relatively large size of wafer 150 of fissionable mateial is useful in helping to provide a sufficient quantity of fission fragments for the practice of this invention.

Insulating covers 156 and 158 are illustrated in FIGS. 6A and 6B, respectively. (These two figures also indicate by line 6—6 the approximate location of the cross section of planar array 148 that is illustrated in FIG. 6.) Electrical conductor 160 is embedded in the inner surface portion 162 of insulating cover 156, and is adjacent and in operative electrical connection with a first surface portion 164 of each wafer 150 through treated contact areas 166 of the conductor. Contact areas 166 are formed of gold.

A similar electrical conductor 168 is embedded in inner surface portion 170 of insulating cover 158, to provide an operative electrical connection with second surface portion 172 of each wafer 150 through treated contact areas 174 of the conductor. Contact areas 174, like areas 166, are formed of gold. Conductor 168 terminates in an extended member 176 to bring conductors 160 and 168 to locations suubstantially facing each other on opposite sides of planar array 148.

As in the embodiment of FIG. 5, electrical conductors 160 and 168 on the inner surface portions of insulating covers 156 and 158, respectively, may if desired be printed circuits. Insulating covers 156 and 158 should be formed of the same type of material as insulating covers 122 and 124.

In this embodiment 148 of a planar array of nuclear fission electrical generator fuel elements, the individual fuel elements in any given row of elements that runs perpendicularly out from the plane of the drawing in FIG. 6 are connected in series, in order to increase the voltage provided by each such row. This is best seen in FIG. 6C, in which the electrical circuit extends between conductor 160 at the upper right-hand corner of the figure—through treated contact area 166, wafer 150, treated contact area 174, conductor 168, contact area 174, wafer 150, contact area 166, conductor 160, contact area 166, wafer 150 and so forth across the figure—and conductor 168 at the lower left-hand corner of the figure.

As seen from FIGS. 6A and 6B, the various horizontal rows of nuclear fission fuel elements in planar array 148 are connected in parallel. This increases the current available from the apparatus of this invention in which this planar array of fuel elements is employed.

Thin Film of Fuel Material

As already pointed out above, the fissionable semi-conductor fuel material of the nuclear fission electrical generator fuel element of this invention may, if desired, be in the form of a quite thin film of material. The film may be, for example, only 100 Angstroms or even less in thickness. The principal advantage of employing a thin film of fuel material having a dimension of this order of magnitude is that such films are easier to prepare with the degree of purity required for the practice of this invention than are thicker crystalline wafers.

Thin films of metal phthalocyanine, for example, can be prepared by the evaportion at elevated temperatures of pure polycrystalline phthalocyanine material onto a substrate at lower temperature, preferably about room temperature. In accordance with conventional practice in the semi-conductor art, masks of suitable shapes may be used to define the areas of crystal growth during the various steps of the process of fabrication of the film.

The evaporation apparatus employed must provide precise control of the source crucible temperature. It has been found that the most suitable residual gas is a rare inert gas such as helium or argon in the pressure range below 1 mm. of mercury.

Well known technical literature contains complete and comprehensive instructions by which any person skilled in the art, with the disclosure of the present application before him, will know how to maintain precise control of the crucible temperature in preparation of the thin film semi-conductor of this invention. Similarly, with the disclosure of the present application before him, the skilled worker will know what temperatures are necessary for the production of the product of this invention.

The vacuum evaporation of semi-conductor materials is a well developed art. Both scientific research laboratories and industrial semi-conductor processing plants have such standard thin film preparation equipment. In fact, such equipment is available from quite a number of manufacturers, and the equipment and the manufacturers are listed in several available "buyers' guides" published by trade journals.

Vacuum evaporation equipment is often modular in design to allow efficient modification when it is found necessary to process another, possibly quite different, thin film material. The modularity of the system extends to include both the vacuum chamber and the electronics of the control system. In one case, one might be interested in the control of chamber gas pressures—the partial pressure of a doping gas, for example—while in another case, the interest may be in the rate of growth of the crystalline thin film. In the latter case, source crucible temperature would need to be controlled precisely while, at the same time, a deposition rate monitor system would be used to follow the film growth.

It is standard practice to take deposition rate information derived from such a monitor system, electronically condition the signal, and then feed the signal back to adjust the source crucible temperature automatically without operator intervention. When the desired conditions within the film are detected, the process is terminated—the whole process being under automatic control, possibly using a small computer.

The changeover from one seemingly specialized set-up to another very different set-up involves simply changing some modules and re-calibrating the system. If a mini-computer is part of the system—as is often the case—some computer programming may also be involved. Thus, takes widely divergent in nature can be easily achieved with a properly designed automated system of modular nature.

The following references are among those that show that vacuum evaporation equipment and control systems adequate to provide the precise control of the crucible temperature necessary for the production of the thin film improved semi-conductors of this invention are well known to those skilled in the art, and that such systems are readily available:

Chopra, Kasturi L., *Thin Film Phenomena,* McGraw-Hill Book Co., N.Y. (1969).

Maissel, Leon I. and Glang, Reinhard, *Handbook of Thin Film Technology,* McGraw-Hill Book C., N.Y. (1970).

Bath, H. H. A., *J. Sci. Instrum.,* vol. 43(6), 374 (1966).

A high degree of cleanliness of the substrate surface prior to film preparation is desirable for the yield of high quality thin films of known crystalline orientation. Surface cleaning techniques are well known. Electron bombardment of the substrate is one common technique which may be used to clean the substrate in the preparation of a film of fuel material for use in the practice of this invention.

The substrate employed may be a conductor, an insulator, or a semi-conductor material, as required for a particular embodiment of this invention. If desired, the film can be made self-supporting by dissolving away the substrate after the film has been deposited thereon.

Plurality of Planar Arrays of Fuel Elements

With thin films of fuel material, a stack of planar arrays of such fuel elements is necessary in order to provide a sufficient total quantity of fissionable material. Such a plurality of planar arrays of fuel elements is illustrated in FIG. 7.

That figure illustrates a nuclear reactor core 178 which comprises a plurality of planar arrays 180 of nuclear fission electrical generator fuel elements 181 that include thin films 182 of the fissionable semi-conductor material uranium phthalocyanine. In the embodiment shown, each film 182 has a p-type region 184 and an n-type region 186, with a p-n barrier region 188 between them. Each film 182 is approximately 900 to 1100 Angstroms in thickness.

The plurality of planar arrays 180 is supported at the bottom on insulating base member 190. As is seen, thin films 182 in the bottommost planar array 180 are in direct contact with base member 190.

First electrical conductor 192 is adjacent and in operative electrical connection with a first surface portion—i.e., top surface portion 194 above p-type region 184—of each film of uranium phthalocyanine, as for example film 182 located at the lower right-hand corner of FIG. 7. Conductor 192 is the output terminal of the nuclear fission electrical generator fuel element of which film 182 is a part toward which groups of electrons are conducted in the generation of a net positive yield of electrical power in accordance with the method of this invention. Conductor 192 is directly connected with lead 196, which is one of the leads through which current flows to deliver electrical power to an external load (not shown in FIG. 7).

Second electrical conductor 198 is adjacent and in operative electrical connection with top surface portion 200, above n-type region 186, of film 182. Conductor 198 is the second output terminal of the fuel element of which 182 is a part. The two conductors 192 and 198 are separated by the impedance of insulator plane 202.

Second electrical conductor 198 at the lower left-hand corner of FIG. 7 is directly connected with lead 204. Lead 204 is the other lead through which current flows to deliver electrical power to the external load.

As is seen, insulator plane 202 and insulating base member 190 serve also to encapsulate thin films 182 of the bottommost planar array 180 of nuclear reactor core 178. Insulator plane 202 also serves as the direct support member for thin films 182 of fissionable semi-conductor material that provide a fuel material for the planar array of fuel elements 180 that is the next-to-the-bottom array in FIG. 7. In addition, before it is in place in the stack of planar arrays of fuel elements that comprise nuclear core 178, plane 202 may be used as a base to support the in situ growth of crystals of uranium phthalocyanine of which films 182 are formed.

The dimensions of thin films 182, conductors 192 and 198, and insulator planes 202 are not shown to scale in FIG. 7. The conductors and insulator members in question are relatively thin—of the order of approximately 100 to 150 Angstroms in thickness—compared to films 182.

The remaining planar arrays 180 shown in FIG. 7 are constructed in a manner similar to what has been described for the bottommost planar array. The number of planar arrays employed in nuclear core 178 depends upon the amount of fissionable material needed to maintain a self-sustaining nuclear chain reaction and generate a net positive yield of electrical power from the nuclear reactor.

When a thin film 182 of fissionable material is subjected to nuclear excitation energy in the practice of this invention, fission fragments from the resulting nuclear fission collide with the semi-conductor portion of the fuel material in the same thin film. At the same time, a substantial number of other fission fragments pass through the still thinner conductors 192 and 198, as well as through insulator planes 202, to collide with thin films 182 in adjacent fuel elements 181. Thus electron-hole pairs are produced in films 182 of several nuclear fission electrical generator fuel elements 181 in addition to the particular fuel element in which a given nuclear fission event takes place.

The passage of fission fragments from a quantity of fuel material in one individual fuel element through intervening conductors and/or insulating support members to the semi-conductor material of another fuel element may take place with the thick crystal embodiments of FIGS. 5 through 5C and 6 through 6C as well as the thin film embodiment of FIG. 7. In any case, the number of fission fragments passing into a given fuel element from other fuel elements in a plurality of fuel elements in a reactor is likely to be roughly equivalent to the number of fission fragments passing out of the given fuel element to other fuel elements in the reactor.

All first conductors 194 which are on the extreme right-hand side of nuclear reactor core 178 in FIG. 7 are electrically connected through conductors 206 with lead 196, and in electrical terms comprise a common point in the circuit embodied in nuclear core 178. All second conductors 198 at the extreme left-hand side of nuclear reactor core 178 are connected with lead 204 through conductors 208, and in electrical terms comprise a second common point in the circuit embodied in nuclear core 178. Leads 196 and 204 are externally connected through a load (not shown).

The connections just described provide operative electrical interconnections between the plurality of planar arrays 180 in core 178. As can be seen, in the embodiment of FIG. 7, all fuel elements within any given planar array 180 are connected in series. As a result, the electromotive force generated across the first and second conductors or output terminals 192 and 198 of each individual fuel element in a planar array 180 will be added to the electromotive force generated across output terminals 192 and 198 of all the other fuel elements in the same planar array.

As will also be seen, each planar array 180 is connected in parallel with the other planar arrays 180 of nuclear core 178. As a result, the current flowing through each planar array will be added at leads 196 and 204 to the current flowing from every other planar array in the nuclear core, to produce the total current flowing between those leads through the external load.

SINGLE CHARGE-AFFECTING FIELD OF FORCE

As has been explained, in one step of the method of this invention the semi-conductor material must be at least partially depleted of unwanted charge carriers which are present in the semi-conductor material by reason of factors other than the collision of fission fragments with the semi-conductor material. Three other steps of the method of this invention include the separation, moving apart and conduction to selected output terminals of group of holes and groups of electrons, respectively, resulting from the collision of fusion fragments with the semi-conductor material. The four steps just described may be carried out by a single charge-affecting force or by a plurality of such fields, as desired.

In nuclear fission electrical generator fuel element 50 illustrated in FIG. 2, depletion of randomly produced, unwanted charge carriers is accomplished in a portion of fissionable semi-conductor material 52 by means of p-n junction region 212. As is understood by persons skilled in the semi-conductor art, a potential barrier exists in junction region 212 between the areas referred to as "p-type region" 214 and "n-type region" 216. Each p-type region contains negatively charged acceptor sites fixed in location within the region, and an equal number of positive charge carriers (holes) which are free to move throughout the region and give the region its name. Each n-type region contains positively charged donor sites fixed in location within the region, and an equal number of negative charge carriers (electrons) which are free to move throughout the region and give the region its name. P-type region 214 and n-type region 216 may be produced by conventional methods of doping semi-conductor materials that are known in the art.

Under the influence of the potential barrier of p-n junction region 212, electrons in or near the p-n junction region will be attracted by the positively charged donor sites in n-type region 216. By the same token, such an electron would be repelled by the negatively charged acceptor sites in p-type region 214. In a similar manner, holes in or near junction region 212 will be attracted by the negatively charged acceptor sites in p-type region 214, and repelled by the positively charged donor sites in n-type region 216. In this manner, unwanted charge carriers are depleted from p-n junction region 212 within the semi-conductor material.

At the same time, the charge-affecting field of force of p-n junction region 212 is effective to separate groups of electrons resulting from the collision of fission fragments with the semi-conductor material from groups of holes resulting from such fission fragment collisions. When p-n junction region 212 is large enough in extent, the charge-affecting field of force of that region separates groups of electrons and groups of holes, moves the groups in generally opposite directions within the semi-conductor material, and conducts them to output terminals 76 and 78, respectively, which are electrically connected with the semi-conductor material. When output terminals 76 and 78 are connected through electrical load 218, a flow of current passes through the load, with the resulting production of electrical power.

Thus, with the fuel element shown in FIG. 2, the depletion, separating, moving apart and conducting steps of the method of this invention are all accomplished by a single charge-affecting field of force, i.e., the field provided by p-n junction 212.

PLURALITY OF CHARGE-AFFECTING FIELDS OF FORCE

FIG. 8 provides a schematic illustration of an embodiment of the apparatus of this invention that utilizes a plurality of charge-affecting fields of force within the semi-conductor material of the fuel element, one of the fields comprising a voltage gradient and another comprising a magnetic field.

In this embodiment, nuclear fission electrical generator fuel element 220 includes a layer 222 of a fissionable semi-conductor material, uranium phthalocyanine.

Semi-conductor material 222 is depleted of charge carriers present by reason of factors other than fission fragment collisions primarily by means of an internal voltage gradient within the material. The voltage gradient is provided within the semi-conductor material by external application of a high voltage such as 1000 or more volts at contact leads 224 and 226, with bias impedances 228,228 employed as shown.

The internal voltage gradient produced by the externally applied voltage is also used to separate electrons and holes created within the semi-conductor material by fission fragment collisions with the semi-conductor material.

In the depleting step just described, the effect of applied magnetic field 230 may be minimal. The same is true of the separating step, since the clouds of electrons and holes have at this juncture just begun to move as coordinated groups through the magnetic field within the semi-conductor material.

Once electron-hole pairs have been separated and the two respective components of those pairs have thus begun coordinated movement within the semi-conductor lattice, further movement apart of the resultant groups of electrons and groups of holes is carried out under the combined influence of the voltage gradient and magnetic field 230. The illustrated magnetic field is perpendicular to the plane of layer 22 of semi-conductor material, and may be produced by a variety of means such as, for example, magnets positioned in the nuclear reactor to apply the magnetic field externally of the semi-conductor material.

As will be explained below, a magnetic field may also be produced within the semi-conductor material as a result of the flow of electrical current that is produced through the external load by the practice of this invention. Magnetic field 230 is independent of such current flow. If desired, the construction of the nuclear reactor, including the size and location of the means for producing magnetic field 230, may be selected so that even when there is a magnetic field produced within the semi-conductor material by the external current flow, the magnetic field within that material is the resultant primarily of externally applied magnetic field 230.

The groups of electrons and groups of holes are also conducted under the combined influence of the voltage gradient and magnetic field 230 to output terminals 232,232 which are adjacent and in operative electrical connection through ohmic contact with opposite surface portions of semi-conductor material 222. As a result, an electrical current flows through load 234 which is connected with the terminals.

The source of the voltage gradient within the semi-conductor material can be varied by utilizing a different form of contact between output terminals 232 and material 222. If one output terminal 232 is in ohmic contact with a first surface portion of layer 222 of semi-conductor material, and the other output terminal 232 is in rectifying contact with a second surface portion of the semi-conductor material spaced from the first portion, the resulting surface barrier arrangement produces an internal voltage gradient within the semi-conductor material. This charge-affecting field and magnetic field 230 then comprise a plurality of charge-affecting fields of force that are effective to carry out the four steps of the method of this invention which are described above, i.e., the depletion, separating, moving apart, and conducting steps.

FIG. 9 provides a schematic illustration of another embodiment of the apparatus of this invention in which a plurality of charge-affecting fields of force is employed. In the apparatus of this figure, the depletion step is carried out at least in part through a charge-affecting field of force comprising a magnetic field produced by the flow of electrical current through an external load.

Coils 236 and 238 are in operative electrical connection with the semi-conductor material of the nuclear fission electrical generator fuel element in nuclear reactor core 240 of the apparatus of this invention. Coils 236 and 238 may be built within the nuclear reactor, imbedded, for example, in the shielding material. The current direction within the coils is indicated by the arrows shown.

In the initial stages of utilization of the apparatus shown in FIG. 9, before current begins to flow, depletion of randomly produced, unwanted charge carriers can be effected by a charge-affecting field of force such as the voltage gradient from a p-n junction within the semi-conductor material, an externally applied voltage gradient, a magnetic field from a permanently installed magnet, or the like. In these initial stages, one or more of the charge-affecting fields of force just mentioned may also be employed to separate, and move in generally opposite directions within the semi-conductor material, a quantity of electrons and a quantity of holes, respectively, that have been produced by fission fragment collisions.

Once additional quantities of electrons and holes, respectively, are separated and moved in generally opposite directions, and current begins to flow through coils 236 and 238 to create a magnetic field of sufficient strength, it is possible to use the magnetic field created by that current flow to effect, at least in part, depletion of the semi-conductor material. The magnetic field thus created may also help to a minimal extent to separate the respective components of the electron-hole pairs which are present in the lattice of the semi-conductor material as a result of fission fragment collisions. By the same token, the magnetic field may also help move apart and conduct to their respective output terminals the resulting groups of electrons and groups of holes in the semi-conductor material.

The current flowing through coils 236 and 238 also flows through useful load 242. Coils 236 and 238, together with useful load 242, make up the external load connected to the output terminals of the nuclear fission electrical generator of FIG. 9.

When desired, only a portion of the current flowing from nuclear reactor core 240 may be shunted through coils 236 and 238, with the rest of the current flowing directly through useful load 242.

OBTAINING NET POSITIVE YIELD OF ELECTRICAL POWER

As already explained above, in the practice of this invention the nuclear fuel is subjected to nuclear excitation energy to produce nuclear fission at a rate sufficient to provide a supply of fission fragments, which in turn create electron-hole pairs by collision with the semi-conductor material utilized in the invention. In order to obtain useful electrical power from the practice of this invention, the occurrence of fission events must be maintained at a rate which is sufficiently frequent to produce a large enough quantity of electron-hole pairs so that there is delivered to an external load a net positive yield of electrical power over the total input of any electrical power into the nuclear reactor, i.e., any electrical power applied to produce one or more charge-affecting fields of force in the semi-conductor material.

One example of electrical power input into the nuclear reactor of this invention is the electrical power consumed in producing the voltage gradient within semi-conductor material 222 by the external application of a high voltage to the semi-conductor material in the single fuel element embodiment of FIG. 8. Another example would be the electrical power consumed in activating an electromagnetic coil to produce magnetic field 230 which is externally applied to semi-conductor material 222 in the same embodiment.

Each of the embodiments of the nuclear reactor fuel elements, planar arrays and cores shown in FIGS. 3A-B, 5, 5A-C, 6, 6A-C and 7 involves more than one nuclear fission electrical generator fuel element. In these embodiments, the rate of production of electrons and holes from fission fragment collisions with semi-conductor material must be maintained at a level to deliver from the entire apparatus in which the plurality of fuel elements is included a net positive yield of electrical power over the total input of any electrical power into the apparatus for the purpose of producing one or more charge-affecting fields of force within the semi-conductor material. And preferably, when a plurality of fuel elements is employed, the rate of production of electrons and holes from fission fragment collisions is maintained at a level to deliver from each individual fuel element a net positive yield of electrical power over the total input of any electrical power for the indicated purpose into that individual fuel element.

The electrical power produced by the practice of this invention is delivered by each individual nuclear fission electrical generator fuel element to the circuit that is connected across the output terminals of that individual fuel element. The circuit in question includes both an internal circuit within the nuclear reactor and an external load. The electromotive force generated across the output terminals of the individual fuel element results in a flow of current through both the internal circuit and the external load, although it is of course only the latter flow of current that produces useful electrical power. In other words, as "seen" by a given individual fuel element utilized in the method and apparatus of this invention, the circuit through which current flows out from and back to that fuel element includes the electrical circuit through any other fuel element or elements with which the given fuel element is connected in series.

One example of such an internal circuit is that faced by any given individual fuel element in FIGS. 6 through 6B, in the form of the electrical circuit through the other fuel elements that go to make up the particular horizontal row of fuel elements in which the given fuel element is located. Another example of such an internal circuit is that faced by any given fuel element in a single horizontal row of fuel elements in FIG. 7, in the form of the electrical circuit through the other fuel elements besides the given element in the row in question.

The remainder of the circuit that is seen by a given individual fuel element, whether the reactor contains a single fuel element or a plurality of fuel elements, is the external load. This is the external load, for example, across terminals 144 and 146 of nuclear reactor 20 in FIG. 1; load 218 in FIG. 2; the external load across electrical conductors 126 and 134 in FIG. 5, conductors 160 and 176 in FIG. 6, or conductors 196 and 204 in FIG. 7; load 234 in FIG. 8; and coil 236, useful load 242, and coil 238 in FIG. 9.

To distinguish between the internal circuit through which current flows from a given nuclear fission electrical generator fuel element and the external load through which the current flows, it is important to note whether the electrical interconnections between the given fuel element and others included in the nuclear reactor are series or parallel connections, or a combination of the two types of connection.

As is seen, the plurality of nuclear fission electrical generator fuel elements of FIG. 3A is electrically connected in parallel, with none being shown as being connected in series. Each output terminal 80 to which groups of charge carriers of one kind, say electrons, are conducted is connected in parallel with all the other output terminals 80 through bus bar 84. By the same token, each output terminal 82 to which groups of charge carriers of a second kind, such as holes, are conducted is connected in parallel with all the other output terminals 82 through bus bar 86.

Similarly, in FIG. 3B, the plurality of fuel elements there shown is connected in parallel, and none is indicated as being connected in series. Output terminals 90 are all connected in parallel with bus bar 96, and output terminals 92 are all connected in parallel with bus bar 98.

FIGS. 5, 5A–C, 6, 6A–C and 7 illustrate various embodiments of the apparatus of this invention that include a plurality of nuclear fission electrical generator fuel elements, in which the plurality of such elements is electrically interconnected either in parallel or with a combination of series and parallel connections.

As already indicated above, all the individual fuel elements in the embodiment of FIGS. 5 and 5A–C are connected in parallel.

In FIGS. 6 through 6B and 7, the series connections between individual fuel elements extend in a horizontal direction, and the parallel connections between the resulting groups of series-connected fuel elements extend in a vertical direction. The series connections increase the magnitude of the voltage obtained from any fuel elements that are thus connected, and the parallel connection increases the flow of current obtained in the practice of this invention.

OVERLAPPING OF GROUPS OF ELECTRONS OR HOLES AT RESPECTIVE OUTPUT TERMINALS

The embodiment of the apparatus of this invention shown in FIG. 2 includes a single quantity of material 52 capable of nuclear fission and having semi-conductor characteristics. In any such embodiment that contains a single nuclear fission electrical generator fuel element, the output terminals of the fuel element are directly connected to the external load to which power is to be delivered.

In the embodiment of FIG. 2, it is preferred that the rate of production of electrons from collisions of fission fragments with semi-conductor material 52 be maintained at a sufficiently high level that groups of electrons are conducted as explained above toward output terminal 76 with such frequency that a portion of substantially every group of electrons that is thus conducted to output terminal 76 is present at that terminal simultaneously for an interval of time with a portion of the immediately preceeding group of electrons that was conducted to the terminal. By the same token, it is preferred that the rate of production of holes from fission fragment collisions with semi-conductor material 52 be maintained at a sufficiently high level that groups of holes are conducted as explained above toward output terminal 78 with such frequency that a portion of substantially every group of holes that has been thus conducted to terminal 78 is present at that terminal simultaneously for an interval of time with a portion of the immediately preceding group of holes that has been conducted to the terminal.

The same is true of the rate of production of electrons and holes from semi-conductor material 222 in the embodiment of FIG. 8, which as in FIG. 2 includes a single quantity of semi-conductor material and thus only a single nuclear fission electrical generator fuel element.

Another way to describe this preferred feature is that the rate of production of electrons from fission fragment collisions is preferably maintained at a level to produce in substantially all instances overlapping of successive groups of electrons or groups of holes (as the case may be) that have been conducted toward their respective output terminals 76 and 78 in FIG. 2, and 232,232 in FIG. 8.

In any nuclear reactor of this invention in which more than one nuclear fission electrical generator fuel element is employed, such as the embodiments of FIGS. 3A, 3B, 5 through 5C, 6 through 6C, and 7, it is likewise preferred that there be overlapping of substantially all groups of a given kind (i.e., electrons or holes, as the case may be) at the terminals of the reactor which are directly connected to the external load to which power is to be delivered.

Such overlapping of groups of charge carriers of a given kind may be produced, for example, by the simultaneous presence of at least portions of groups of charge carriers of the appropriate kind that have been conducted in parallel to the respective bus bar designated as element 84 or 86 in FIG. 3A, as element 96 or 98 in FIG. 3B, and as vertical member 126 at the left-hand side of FIG. 5B or horizontal member 134 at the bottom of FIG. 5C.

Similarly, groups of charge carriers of a given kind that are conducted to the respective output terminals of the fuel elements that are connected in series in any given horizontal row of FIGS. 6 through 6B will have a cumulative effect at vertical member 160 at the left-hand side of FIG. 6A and at vertical member 168 at the left-hand side of FIG. 6B. There is an additional cumulative overlapping effect that results from the parallel connection in FIGS. 6A and 6B between the horizontal rows of fuel elements in those figures.

By the same token, groups of charge carriers of a given kind that are conducted to the respective output terminals of the series-connected fuel elements in any given horizontal plane in the embodiment of FIG. 7 will have a cumulative effect at each end of each horizontal row of fuel elements, and an additional cumulative effect by reason of the ultimate parallel connection of the appropriate bus bar 206 or 208 in that figure.

It is further preferred, in any nuclear reactor of this invention in which more than one nuclear fission electrical generator fuel element is utilized, that overlapping of substantially all groups of charge carriers of a given kind such as just described also be present with respect to each individual fuel element of the reactor. In other words, it is preferred that the overlapping described be present not only at the reactor leads that are directly connected to the external load to which power is delivered, but also within the internal circuit of the plurality of fuel elements, at each output terminal that is in operative electrical connection with the semi-conductor material employed in the respective individual fuel elements of the reactor.

UTILIZATION OF EXISTING NUCLEAR REACTORS

One of the advantages of the present invention is that existing nuclear reactors can be utilized in the practice of this invention with a minimum of modification of the existing equipment.

FIG. 10 shows a cross sectional view of one embodiment of the nuclear fission electrical generator fuel element of this invention designed specifically to be compatible for use with an existing nuclear reactor not originally designed for the practice of this invention. The overall shape of the fuel element is long, thin, and cylindrical, so that it will fit into the openings of complementary shape which are commonly provided within the core of a conventional nuclear reactor.

The outer wall of fuel element 244, in the shape of a long, thin cylinder 246, is formed of aluminum or other electrical conductor. At the bottom of the interior of cylindrically shaped outer conductor 246 is an annular insulating sleeve 248, which extends upward for perhaps one-fifth of the total height of member 246. A cylindrical plug 250 of material capable of nuclear fission and having semi-conductor chracteristics, uranium 235 phthalocyanine, fits more or less snugly within insulating sleeve 248, and rests on bottom wall 252 of conductor member 246.

A first surface, the bottom surface 254, of plug 250 is treated with a layer of gold or platinum, to improve the operative electrical connection between the semi-conductor material of the plug and bottom wall 252 of member 246. A second surface, the top surface 256, of plug 250 is similarly treated with gold or platinum to improve the operative electrical connection between the plug of semi-conductor material and bottom plate 258 of piston-like aluminum conductor 260, which is positioned inside and concentrically with long, thin conducting cylinder 246.

Annular seal 262 of aluminum oxide is positioned just above bottom plate 258 of conductor 260, where it acts both as an insulator and as a spacer member between outer cylindrical conductor 246 and inner piston-like conductor 260. Similar insulating annular spacer members 264 and 266, both somewhat thinner in form than annular seal 262, are positioned midway up, and at the top of, the shank of conductor member 260.

As will be seen, a plurality of fuel elements 244 can be positioned in the core of an existing nuclear reactor in cylindrical openings 268 in two support plates 270, one located at the top of the cylindrical fuel elements and one near the middle portion thereof. Plates 270 are formed of stainless steel, with annular, insulating inserts 272 of aluminum oxide defining cylindrical openings 268. Plates 270 and insulating inserts 272 are shown in fragmentary plan view in FIG. 10A.

Appropriate electrical connections can be made to electrical conductors 246 and 260 to complete the electrical circuit through an external load. Subjecting fissionable semi-conductor material 250 to a neutron flux, and at the same time to at least one charge-affecting field of force in the manner explained above, will generate electrical power directly without the necessity of an intervening thermal energy stage, all in accordance with the method of this invention.

The above detailed description has been given for clearness of understanding only. No unnecessary limitations should be understood therefrom, as modifications will be obvious to those skilled in the art.

I claim:

1. An improved semi-conductor which comprises a film of fissionable, semi-conductive metal phthalocyanine, said film being substantially free of phosphorus nitride and derivatives of the same and being supported on the external surface of a solid, rigid substrate, said substrate being substantially free of water.

2. The semi-conductor of claim 1 in which said film of fissionable, semi-conductive metal phthalocyanine comprises uranium phthalocyanine.

3. The semi-conductor of claim 1 in which said substrate comprises a material that is an electrical conductor.

4. The semi-conductor of claim 3 in which said electrical conductor is selected from the group consisting of aluminum, zirconium and alloys thereof.

5. The semi-conductor of claim 1 in which said substrate is an electrical insulator.

6. The semi-conductor of claim 5 in which said electrical insulator is selected from the group consisting of aluminum oxide, zirconium oxide, beryllium oxide and mixtures thereof.

7. The semi-conductor of claim 2 in which said uranium phthalocyanine is comprised of uranium (IV) bis-phthalocyanine.

8. The semi-conductor of claim 2 in which said uranium phthalocyanine is comprised of uranyl phthalocyanine.

9. The semi-conductor of claim 1 in which said film of fissionable, semi-conductive metal phthalocyanine comprises thorium phthalocyanine.

10. The semi-conductor of claim 9 in which said thorium phthalocyanine is comprised of thorium (IV) bis-phthalocyanine.

11. The semi-conductor of claim 9 in which said thorium phthalocyanine is comprised of thoranyl phthalocyanine.

12. The semi-conductor of claim 1 in which said film of fissionable, semi-conductive metal phthalocyanine comprises plutonium phthalocyanine.

13. The semi-conductor of claim 12 in which said plutonium phthalocyanine is comprised of plutonium (IV) bis-phthalocyanine.

14. The semi-conductor of claim 12 in which said plutonium phthalocyanine is comprised of plutonyl phthalocyanine.

15. The semi-conductor of claim 1 in which said film of fissionable semi-conductive metal phthalocyanine has the alpha crystalline modification.

16. The semi-conductor of claim 1 in which said film of fissionable semi-conductive metal phthalocyanine has the beta crystalline modification.

17. The semi-conductor of claim 1 in which said film of fissionable semi-conductive metal phthalocyanine has the gamma crystalline modification.

18. The semi-conductor of claim 1 in which said film of fissionable semi-conductor metal phthalocyanine has a crystal axis orientation such that the plane of the phthalocyanine molecule is oriented substantially normal to the surface of the substrate.

19. The semi-conductor of claim 1 in which said film of fissionable semi-conductive metal phthalocyanine has a crystal axis orientation such that the plane of the phthalocyanine molecule is tilted at an acute angle with respect to the surface of the substrate.

20. The semi-conductor of claim 1 in which said film of fissionable semi-conductive metal phthalocyanine has a crystal axis orientation such that the plane of the phthalocyanine molecule is oriented substantially normal to the surface of the substrate.

21. The semi-conductor of claim 1 in which said substrate is substantially free of any solvent.

22. The semi-conductor of claim 1 in which said film of fissionable, semi-conductive metal phthalocyanine is substantially continuous in form in each direction along the film.

23. The semi-conductor of claim 1 in which said film of fissionable, semi-conductive metal phthalocyanine is substantially free of voids of more than about 50 Angstroms in maximum transverse dimension.

24. The semi-conductor of claim 1 in which said film of fissionable, semi-conductive metal phthalocyanine is substantially free of voids of more than about 40 Angstroms in maximum transverse dimension.

25. The semi-conductor of claim 1 in which said film of fissionable, semi-conductive metal phthalocyanine is substantially free of voids of more than about 30 Angstroms in maximum transverse dimension.

26. The semi-conductor of claim 1 in which the substrate has a resistivity of more than about $10^{15}$ ohm-cms.

27. The semi-conductor of claim 1 in which the substrate has a resistivity of more than about $10^{18}$ ohm-cms.

28. The semi-conductor of claim 1 in which the substrate has a resistivity no greater than about $10^{-4}$ ohm-cms.

29. The semi-conductor of claim 1 in which the substrate has a resistivity no greater than about $10^{-5}$ ohm-cms.

30. The semi-conductor of claim 1 in which the substrate has a resistivity no greater than about $10^{-6}$ ohm-cms.

* * * * *